(12) United States Patent
Ngo et al.

(10) Patent No.: US 8,306,060 B2
(45) Date of Patent: Nov. 6, 2012

(54) SYSTEM AND METHOD FOR WIRELESS COMMUNICATION OF UNCOMPRESSED VIDEO HAVING A COMPOSITE FRAME FORMAT

(75) Inventors: Chiu Ngo, San Francisco, CA (US); Huai-Rong Shao, San Jose, CA (US); Harkirat Singh, Santa Clara, CA (US); Xiangping Qin, San Jose, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 553 days.

(21) Appl. No.: 11/784,368

(22) Filed: Apr. 5, 2007

(65) Prior Publication Data

US 2008/0250294 A1  Oct. 9, 2008

Related U.S. Application Data

(60) Provisional application No. 60/857,271, filed on Nov. 7, 2006.

(51) Int. Cl.
*H04J 3/24* (2006.01)
(52) U.S. Cl. ......... 370/473; 370/466; 370/467; 370/335
(58) Field of Classification Search .......... 370/229, 370/230, 335, 466, 467, 473; 382/240
See application file for complete search history.

(56) References Cited

U.S. PATENT DOCUMENTS

| | | | |
|---|---|---|---|
| 5,790,523 A * | 8/1998 | Ritchie et al. | 370/241 |
| 6,285,681 B1 * | 9/2001 | Kolze et al. | 370/442 |
| 6,757,851 B1 * | 6/2004 | Park et al. | 714/48 |
| 6,771,660 B1 * | 8/2004 | Bourlas et al. | 370/466 |
| 6,775,804 B1 | 8/2004 | Dawson | |
| 6,782,503 B1 | 8/2004 | Dawson | |
| 6,999,088 B1 * | 2/2006 | Van Dyke et al. | 345/544 |
| 7,139,319 B2 | 11/2006 | Loheit et al. | |
| 7,228,154 B2 * | 6/2007 | Champion et al. | 455/557 |
| 7,257,095 B2 | 8/2007 | Liu | |
| 7,333,665 B2 * | 2/2008 | Orr | 382/240 |

(Continued)

FOREIGN PATENT DOCUMENTS

WO    WO 02/057877 A2    7/2002

OTHER PUBLICATIONS

FreshNews.com, SiBEAM Receives Equity Investment from Best Buy, http://freshnews.com/print/node/261440, Jan. 4, 2010, 2 pages.
Hachman, "CE Giants back Amimon's Wireless HDTV Tech," online: www.pcmag.com, 1 page, Jul. 23, 2008.

(Continued)

*Primary Examiner* — Ricky Ngo
*Assistant Examiner* — Dewanda Samuel
(74) *Attorney, Agent, or Firm* — Kenneth L. Sherman, Esq.; Michael Zarrabian, Esq.; Sherman & Zarrabian LLP

(57) ABSTRACT

A system and method for efficiently communicating uncompressed video and for efficiently communicating corresponding acknowledgements in a system for wireless communication of uncompressed video are disclosed. In one embodiment, the method includes aggregating multiple sub-packets of different types of data into a composite packet. The different types of data may include video, audio, control data, extraneous data files, and others. A robust composite packet configuration can provide for more flexible and more efficient transmission of data on the high rate channel as well as more efficient transmission of acknowledgements on the low rate channel.

46 Claims, 16 Drawing Sheets

U.S. PATENT DOCUMENTS

| | | | |
|---|---|---|---|
| 7,436,776 B2 | 10/2008 | Koga | |
| 7,633,970 B2 * | 12/2009 | van Kampen et al. | 370/473 |
| 7,653,844 B2 | 1/2010 | Sasaki | |
| 7,746,842 B2 | 6/2010 | Sugaya | |
| 7,889,765 B2 * | 2/2011 | Brooks et al. | 370/505 |
| 2002/0150040 A1 * | 10/2002 | Tong et al. | 370/216 |
| 2004/0004945 A1 * | 1/2004 | Monsen | 370/328 |
| 2004/0162083 A1 * | 8/2004 | Chen et al. | 455/454 |
| 2004/0258092 A1 | 12/2004 | Sugaya | |
| 2004/0264497 A1 | 12/2004 | Wang et al. | |
| 2005/0094675 A1 * | 5/2005 | Bhushan et al. | 370/527 |
| 2005/0135611 A1 * | 6/2005 | Hardacker | 380/33 |
| 2005/0190718 A1 * | 9/2005 | Holtzman et al. | 370/328 |
| 2005/0289631 A1 | 12/2005 | Shoemake | |
| 2006/0013168 A1 * | 1/2006 | Agrawal et al. | 370/335 |
| 2006/0018269 A1 * | 1/2006 | Agrawal et al. | 370/321 |
| 2006/0029099 A1 * | 2/2006 | Jang et al. | 370/473 |
| 2006/0056443 A1 * | 3/2006 | Tao et al. | 370/462 |
| 2006/0092893 A1 | 5/2006 | Champion et al. | |
| 2007/0165674 A1 | 7/2007 | Oh et al. | |
| 2007/0189397 A1 * | 8/2007 | Ngo et al. | 375/240.26 |
| 2007/0211667 A1 * | 9/2007 | Agrawal et al. | 370/335 |
| 2007/0230461 A1 * | 10/2007 | Singh et al. | 370/389 |
| 2007/0234134 A1 * | 10/2007 | Shao et al. | 714/701 |
| 2007/0286103 A1 * | 12/2007 | Niu et al. | 370/310 |
| 2007/0291853 A1 * | 12/2007 | Kim et al. | 375/240.27 |
| 2008/0025211 A1 * | 1/2008 | Karaoguz et al. | 370/229 |
| 2008/0130617 A1 | 6/2008 | Singh et al. | |
| 2008/0192726 A1 * | 8/2008 | Mahesh et al. | 370/349 |
| 2008/0192776 A1 | 8/2008 | Fleming et al. | |
| 2009/0323563 A1 * | 12/2009 | Ho et al. | 370/280 |

OTHER PUBLICATIONS

LG Electronics, et al., WirelessHD Specification Version 1.0 Overview, Oct. 9, 2007, pp. 1-77.

NEC develops compact millimeter-wave transceiver for uncompressed HDTV signal transmission, NE Asia Online, Apr. 5, 2005, (Downloaded from http://neasia.nikkeibp.com/topstory/000913 on Sep. 29, 2006.)

International Search Report dated Feb. 11, 2008 for PCT/KR2007/005545, filed Nov. 5, 2007.

International Preliminary Report on Patentability and Written Opinion dated May 12, 2009 for PCT/KR2007/005545, filed Nov. 5, 2007.

International Search Report and Written Opinion dated Jul. 3, 2008 for PCT/KR2008/000798, filed Feb. 12, 2008.

Caetano, Lianne, SiBEAM—60 GHz Architecture for Wireless Video Display, SiBEAM, Inc. White Paper, Mar. 2006, [Available online: http://www.sibeam.com/whtpapers/60_GHz_for_WirelessHD_3_06.pdf], pp. 1-6.

U.S. Office Action dated Sep. 7, 2010 in U.S. Appl. No. 11/868,325, filed Oct. 5, 2007.

Chinese Non-Final Office Action mailed Jun. 22, 2011 in Chinese Patent Application No. 200780035806.2, pp. 1-11, China Patent Office, Beijing, People's Republic of China (English-language translation attached, 18 pages).

Chinese Second Office Action mailed Mar. 16, 2012 in Chinese Patent Application No. 200780035806.2, pp. 1-11, The State Intellectual Property Office of P.R. China, Beijing, People's Republic of China (English-language translation attached, 18 pages).

* cited by examiner

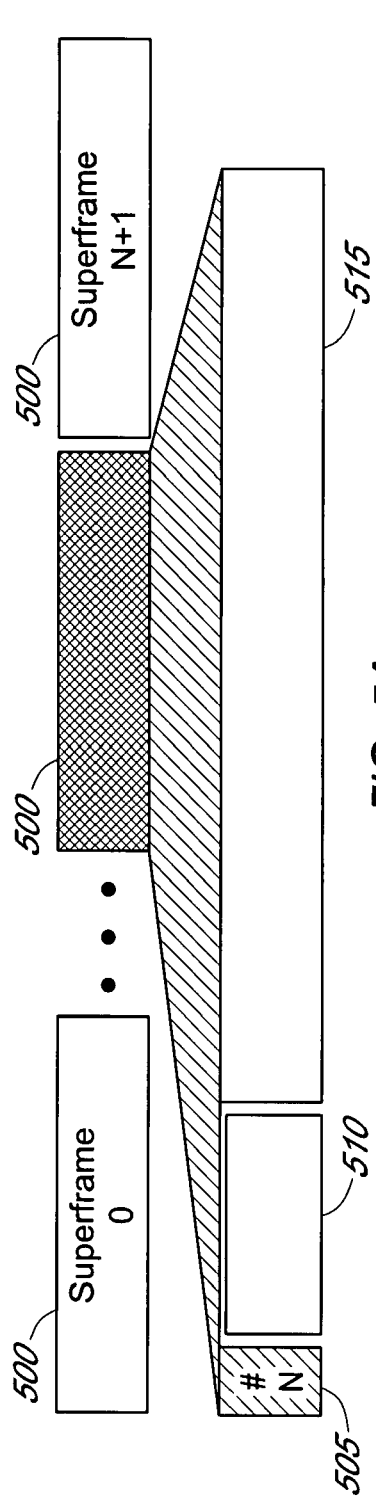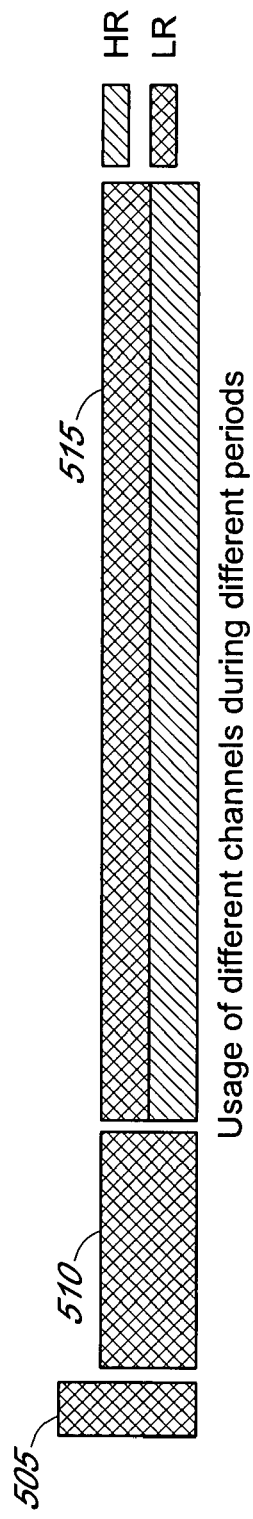

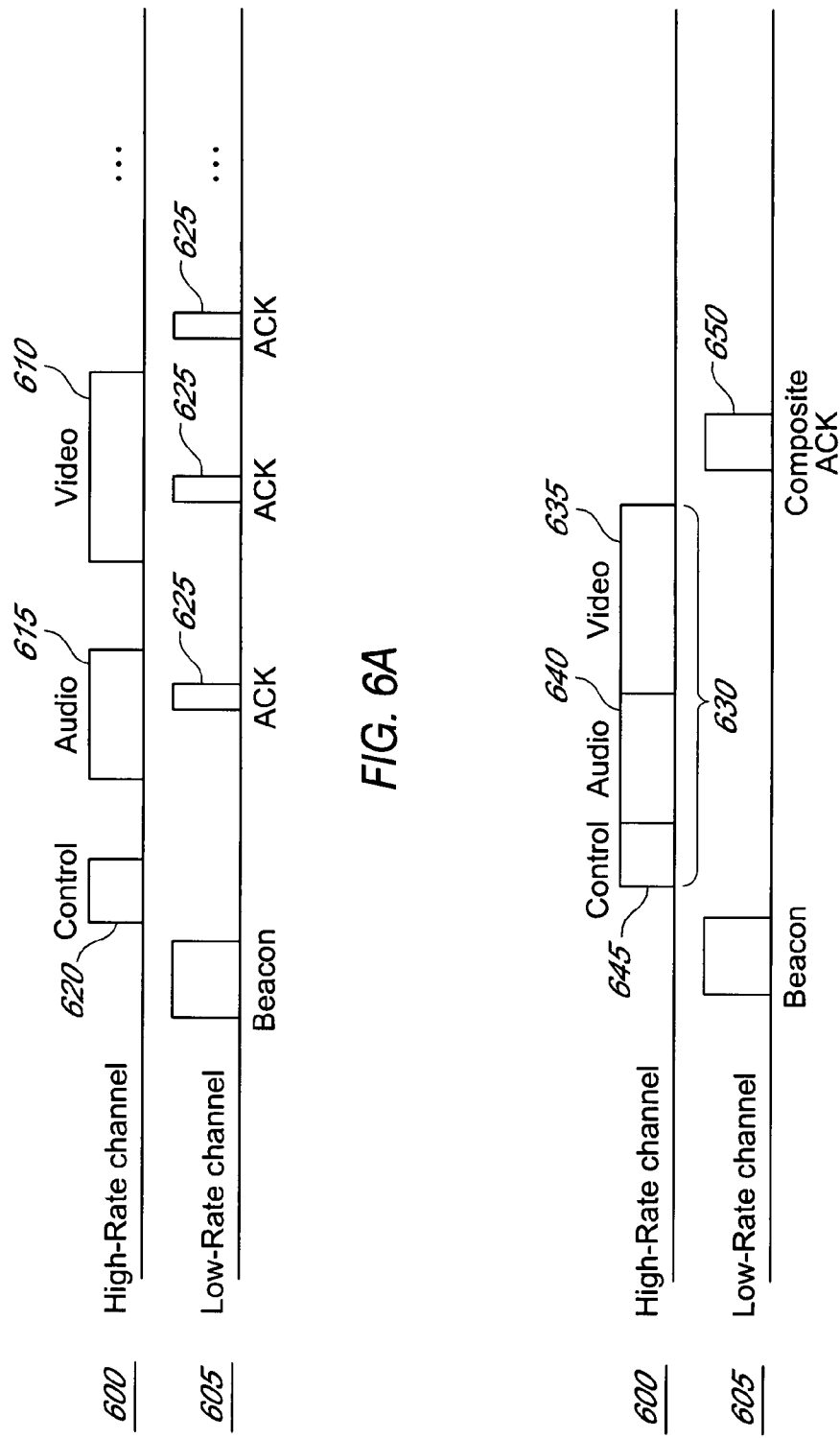

SYSTEM AND METHOD FOR WIRELESS COMMUNICATION OF UNCOMPRESSED VIDEO HAVING A COMPOSITE FRAME FORMAT

CROSS-REFERENCE TO RELATED APPLICATIONS

This application claims priority from U.S. Provisional Patent Application Ser. No. 60/857,271, entitled "COMPOSITE FRAME FORMAT AND RELATED MECHANISMS FOR UNCOMPRESSED HD VIDEO OVER 60 GHZ WIRELESS", filed Nov. 7, 2006, which is incorporated herein by reference in its entirety.

BACKGROUND OF THE INVENTION

1. Field of the Invention

The present invention relates to wireless transmission of video information, and in particular, to transmission of uncompressed video information over wireless channels.

2. Description of the Related Technology

With the proliferation of high quality video, an increasing number of electronic devices, such as consumer electronic devices, utilize high definition (HD) video which can require multiple gigabits per second (Gbps) in bandwidth for transmission. As such, when transmitting such HD video between devices, conventional transmission approaches compress the HD video to a fraction of its size to lower the required transmission bandwidth. The compressed video is then decompressed for consumption. However, with each compression and subsequent decompression of the video data, some data can be lost and the picture quality can be reduced.

The High-Definition Multimedia Interface (HDMI) specification allows transfer of uncompressed HD signals between devices via a cable. While consumer electronics makers are beginning to offer HDMI-compatible equipment, there is not yet a suitable wireless (e.g., radio frequency) technology that is capable of transmitting uncompressed HD video signals. Wireless local area network (WLAN) and similar technologies can suffer interference issues when several devices that do not have the bandwidth to carry the uncompressed HD signals are connected to the network.

Transfer of uncompressed video signals requires more use of wireless channels than that of compressed video signals because of a higher volume of data being transferred. Thus, there is a need to provide a system and a method which allow an efficient use of wireless channels while enhancing the accuracy and quality of data being transferred.

SUMMARY OF CERTAIN INVENTIVE ASPECTS

The system, method, and devices of the invention each have several aspects, no single one of which is solely responsible for its desirable attributes. Without limiting the scope of this invention as expressed by the claims which follow, its more prominent features will now be discussed briefly. After considering this discussion, and particularly after reading the section entitled "Detailed Description of Certain Inventive Embodiments" one will understand how the sample features of this invention provide advantages that include simpler implementation, more flexibility and improved channel efficiency.

One aspect is a method of transmitting uncompressed video data. The method of this aspect includes selectively error control encoding data in two or more subpackets using one or more error coding schemes selected from a plurality of error coding schemes, selectively mapping the data in each of the subpackets to symbols using one or more modulation schemes selected from a plurality of modulation schemes, and combining the subpackets to form a composite packet.

Another aspect is a method of receiving uncompressed video data. The method of this aspect includes receiving a composite packet comprising two or more subpackets, where two or more error control encoding schemes and/or two or more modulation schemes were used to selectively encode and modulate the two or more subpackets. The method further includes processing the subpackets to perform forward error control decoding and to demodulate each of the subpackets, wherein the forward error control decoding is related to the error control encoding scheme and the demodulating is related to the modulation scheme that were used to encode each subpacket.

Another aspect is a system for transmitting uncompressed video data. The system of this aspect includes a forward error control subsystem configured to selectively error control encode data in each of a plurality of subpackets using one or more error coding schemes selected from a plurality of error coding schemes, a mapper subsystem configured to selectively map the data in each of the subpackets to symbols using one or more modulation schemes selected from a plurality of modulation schemes, and a packetization subsystem configured to combine the subpackets to form a composite packet.

Another aspect is a system for receiving uncompressed video data. The system of this aspect includes a receiver configured to receive a composite packet comprising two or more subpackets, where two or more error control encoding schemes and/or two or more modulation schemes were used to selectively encode and modulate the two or more subpackets. The system further includes a forward error control subsystem configured to perform forward error control decoding of the subpackets based on which error control encoding scheme was used to encode each subpacket, and a demapper subsystem configured to demodulate the subpackets based on the modulation scheme that was used to modulate each subpacket.

Another aspect is a system for transmitting uncompressed video data. The system of this aspect includes means for selectively error control encoding data in two or more subpackets using one or more error coding schemes selected from a plurality of error coding schemes, means for selectively mapping the data in each of the subpackets to symbols using one or more modulation schemes selected from a plurality of modulation schemes, and means for combining the subpackets to form a composite packet.

Another aspect is a system for receiving uncompressed video data. The system of this aspect includes means for receiving a composite packet comprising two or more subpackets, where two or more error control encoding schemes and/or two or more modulation schemes were used to selectively encode and modulate the two or more subpackets. The system further includes means for processing the subpackets to perform forward error control decoding and to demodulate each of the subpackets, where the forward error control decoding is related to the error control encoding scheme and the demodulating is related to the modulation scheme that were used to encode each subpacket.

BRIEF DESCRIPTION OF THE DRAWINGS

FIG. 5a is an illustration of a sequence of superframes and a breakdown of an example of a superframe time period that may be used in a wireless network such as illustrated in FIG. 1.

FIG. 5b is an illustration of an example of time division duplexing of the low and high rate channels illustrated in FIG. 3 within a superframe period.

FIG. 6a is an illustration of an example of time division duplexing of the low and high rate channels illustrated in FIG. 3 within a superframe period, where individual packets of multimedia data are communicated over the high rate channel and individual acknowledgements are communicated on the low rate channel.

FIG. 6b is an illustration of another example of time division duplexing of the low and high rate channels illustrated in FIG. 3 within a superframe period, where a composite packet of multimedia data is communicated over the high rate channel and a composite acknowledgement is communicated on the low rate channel.

FIG. 10b is a flowchart illustrating in more detail an example of certain functions performed at block 1010 of the method illustrated in FIG. 10a.

DETAILED DESCRIPTION OF CERTAIN INVENTIVE EMBODIMENTS

Certain embodiments provide a method and system for transmission of uncompressed HD video information from a sender to a receiver over wireless channels.

The following detailed description is directed to certain sample embodiments of the invention. However, the invention can be embodied in a multitude of different ways as defined and covered by the claims. In this description, reference is made to the drawings wherein like parts are designated with like numerals throughout.

Embodiments include systems and methods of data processing in wireless communication devices for communication of uncompressed video data will be described. Video data may include one or more of motion video, still images, or any other suitable type of visual data. Composite packets including multiple subpackets of multimedia data are transmitted and received over a high rate channel. Acknowledgement messages confirming receipt of the subpackets are transmitted over a low rate channel.

Figure 1:
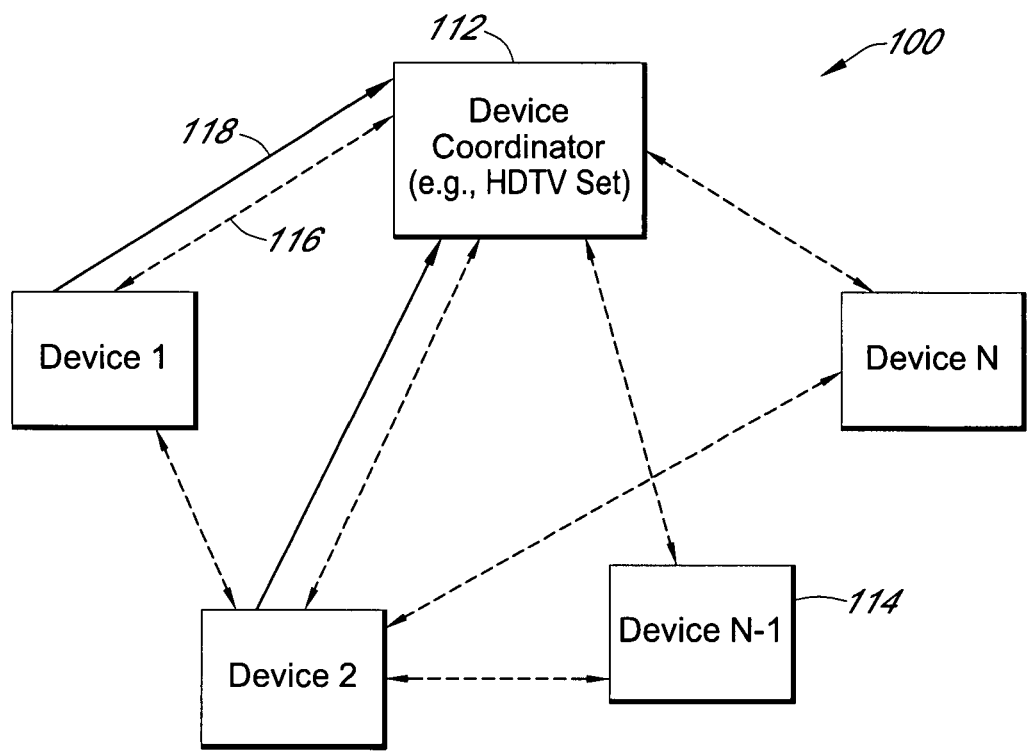
FIG. 1 is a functional block diagram of a wireless network that implements uncompressed HD video transmission between wireless devices according to one embodiment of the system and method.

Exemplary implementations of the embodiments in a wireless high definition (HD) audio/video (A/V) system will now be described. FIG. 1 shows a functional block diagram of a wireless network 100 that implements uncompressed HD video transmission between AN devices such as an A/V device coordinator and A/V stations, according to certain embodiments. In other embodiments, one or more of the devices can be a computer, such as a personal computer (PC). The network 100 includes a device coordinator 112 and multiple client devices or A/V stations 114 (e.g., Device 1, . . . , Device N).

The A/V stations 114 utilize a low-rate (LR) wireless channel 116 (dashed lines in FIG. 1), and may use a high-rate (HR) channel 118 (heavy solid lines in FIG. 1), for communication between any of the devices. The device coordinator 112 uses a low-rate channel 116 and a high-rate wireless channel 118, for communication with the stations 114. Each station 114 uses the low-rate channel 116 for communications with other stations 114. The high-rate channel 118 supports single direction unicast transmission over directional beams established by beamforming, with e.g., multi-Gb/s bandwidth, to support uncompressed HD video transmission. For example, a set-top box can transmit uncompressed video to a HD television (HDTV) over the high-rate channel 118. The low-rate channel 116 can support bi-directional transmission, e.g., with up to 40 Mbps throughput in certain embodiments. The low-rate channel 116 is mainly used to transmit control frames such as acknowledgement (ACK) frames. For example, the low-rate channel 116 can transmit an acknowledgement from the HDTV to the set-top box. It is also possible that some low-rate data like audio and compressed video can be transmitted on the low-rate channel between two devices directly. Time division duplexing (TDD) is applied to the high-rate and low-rate channel. At any one time, the low-rate and high-rate channels cannot be used in parallel for transmission, in certain embodiments. Beamforming technology can be used in both low-rate and high-rate channels. The low-rate channels can also support omni-directional transmissions. Details of the low and high-rate channels will be discussed below in reference to FIGS. 3 and 4.

In one example, the device coordinator 112 is a receiver of video information (referred to as "receiver 112"), and the station 114 is a sender of the video information (referred to as "sender 114"). For example, the receiver 112 can be a sink of video and/or audio data implemented, such as, in an HDTV set in a home wireless network environment which is a type of WLAN. The sender 114 can be a source of uncompressed video or audio. Examples of the sender 114 include a set-top box, a DVD player or recorder, digital camera, camcorder, and so forth.

Figure 2:
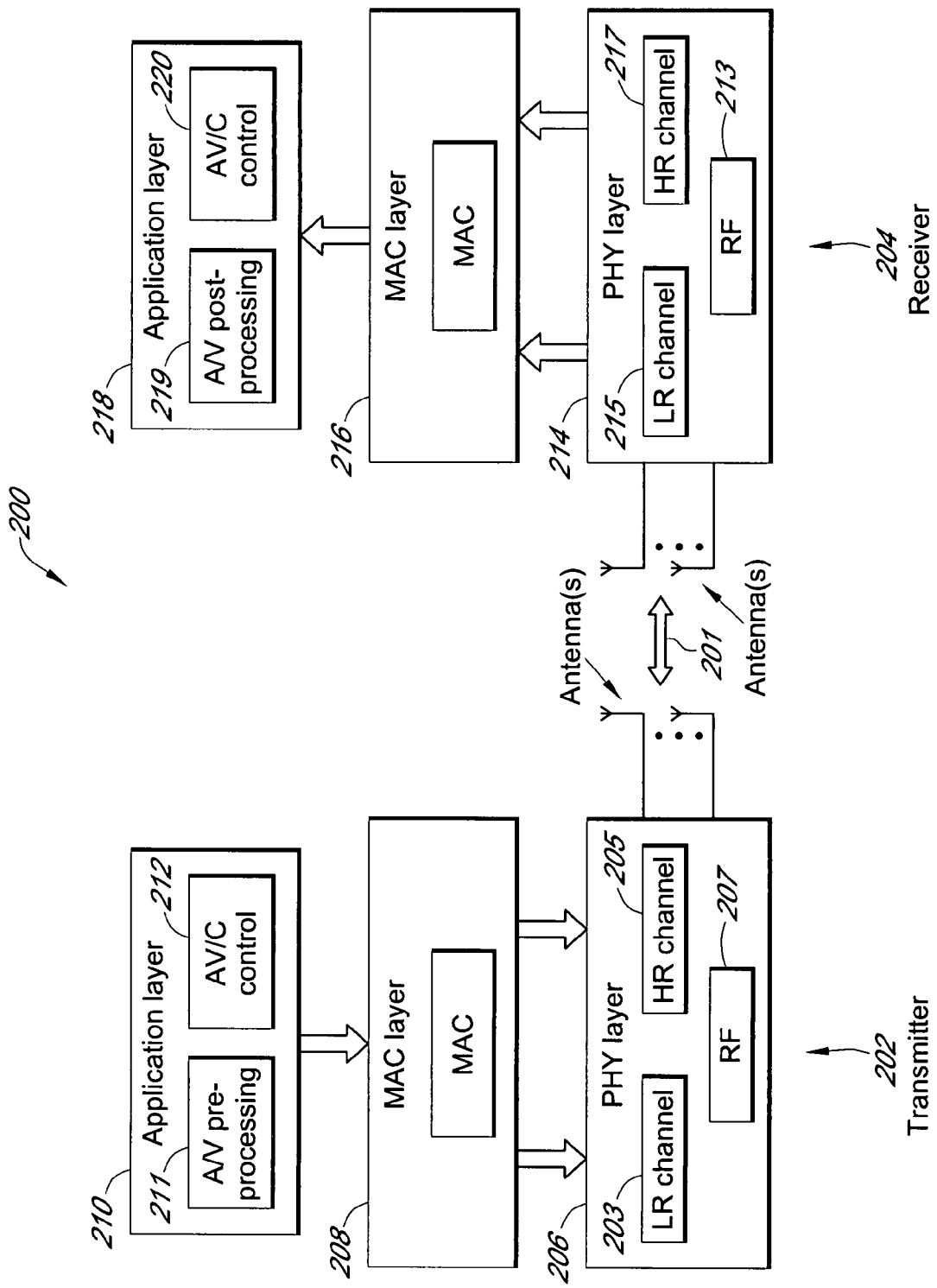
FIG. 2 is a functional block diagram of an example communication system for transmission of uncompressed HD video over a wireless medium, according to one embodiment of the system and method.

FIG. 2 illustrates a functional block diagram of an example communication system 200. The system 200 includes a wireless transmitter 202 and wireless receiver 204. The transmitter 202 includes a physical (PHY) layer 206, a media access control (MAC) layer 208 and an application layer 210. Similarly, the receiver 204 includes a PHY layer 214, a MAC layer 216, and an application layer 218. The PHY layers provide wireless communication between the transmitter 202 and the receiver 204 via one or more antennas through a wireless medium 201.

The application layer 210 of the transmitter 202 includes an ANV pre-processing module 211 and an audio video control (AV/C) module 212. The A/V pre-processing module 211 can perform pre-processing of the audio/video such as partitioning of uncompressed video. The AV/C module 212 provides a standard way to exchange A/V capability information. Before a connection begins, the AV/C module negotiates the A/V formats to be used, and when the need for the connection is completed, AV/C commands are used to stop the connection.

In the transmitter 202, the PHY layer 206 includes a low-rate (LR) channel 203 and a high rate (HR) channel 205 that are used to communicate with the MAC layer 208 and with a radio frequency (RF) module 207. In certain embodiments, the MAC layer 208 can include a packetization module (not shown). The PHY/MAC layers of the transmitter 202 add PHY and MAC headers to packets and transmit the packets to the receiver 204 over the wireless channel 201.

In the wireless receiver 204, the PHY/MAC layers 214, 216, process the received packets. The PHY layer 214 includes a RF module 213 connected to the one or more antennas. A LR channel 215 and a HR channel 217 are used to communicate with the MAC layer 216 and with the RF module 213. The application layer 218 of the receiver 204 includes an A/V post-processing module 219 and an AV/C module 220. The module 219 can perform an inverse processing method of the module 211 to regenerate the uncompressed video, for example. The AV/C module 220 operates in a complementary way with the AV/C module 212 of the transmitter 202.

Figure 3:
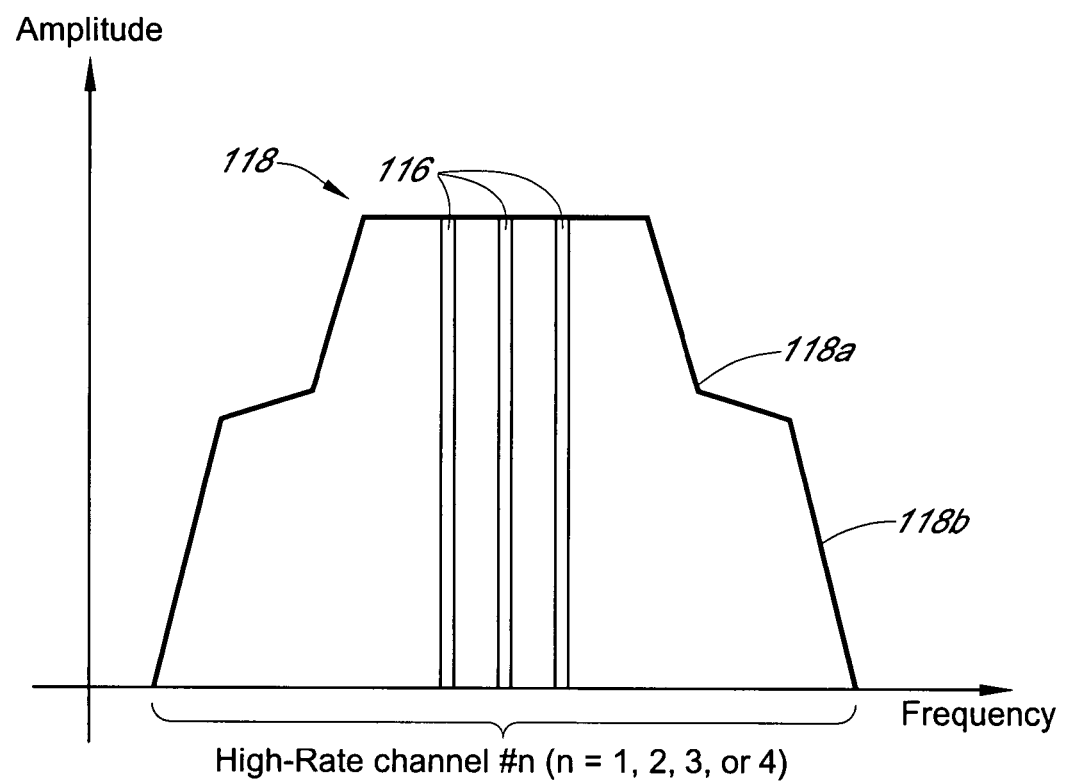
FIG. 3 is a frequency map of an example of overlapping high rate and low rate channels that may be used in a wireless network such as illustrated in FIG. 1.

As discussed above, the frequency bands of the low-rate and high-rate channels overlap. There may be portions of the high-rate channel that may not overlap with a low-rate channel and conversely, there may be portions of a low-rate channel that do not overlap the high-rate channel, depending on the embodiment. FIG. 3 is a frequency map of an example of overlapping high-rate and low-rate channels that may be used in a wireless network such as illustrated in FIG. 1. In this example, three low-rate channels 116 are positioned within a single high-rate channel 118. There can be more or fewer low-rate channels 116 than three as in this example. The low-rate channels 116 may have a bandwidth in a range from about 50 MHz. to about 200 MHz, preferably from about 80 MHz to about 100 MHz.

There may also be multiple high-rate channels 118 as indicated by the "channel #n" in FIG. 3. In this example, there are 4 high-rate channels 118. The high-rate channel 118 is shown as having sloping sidebands 118a and 118b. This is done for limiting inter-channel interference between adjacent channels. However, some embodiments may not use sloping sidebands. The low-rate channels 116 may also exhibit sloping sidebands (not shown). The high-rate and low-rate channels may be present in any frequency band. The bandwidth of the high-rate channel used depends on the data rate of the uncompressed video to be communicated. The bandwidth may be large enough to support a data rate in a range from about 1 Gbps to about 4 Gbps. Frequency bands that are used for other wireless systems can be used. The choice of frequency bands may depend on the regulatory agency of the country in which the system is being used. In the United States for example, frequency bands are allocated for unlicensed devices including those bands referred to as 800 MHz, 2.4 GHz, 5 GHz and 60 GHz. Any of these may be used in embodiments, preferably the 5 GHz or 60 GHz bands.

Figure 4B:
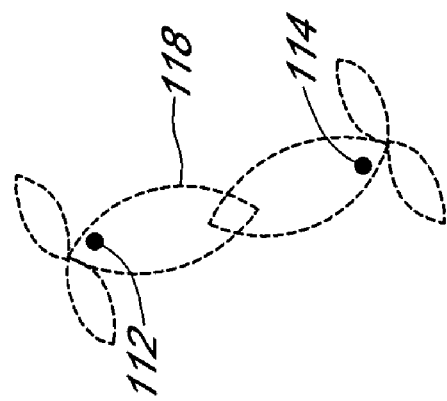
FIGS. 4a and 4b are illustrations of examples of omnidirectional and directional channel beams that may be used in a wireless network such as illustrated in FIG. 1.
Figure 4A:
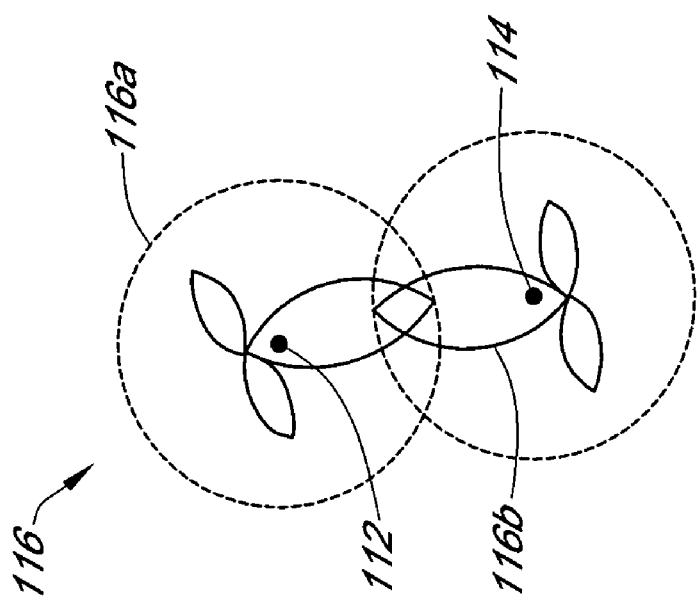

FIGS. 4A and 4B are illustrations of examples of omnidirectional and directional channel beams that may be used in a wireless network such as illustrated in FIG. 1. FIG. 4a depicts a device coordinator 112 communicating with a client device 114 over a low-rate channel 116. The low-rate channel 116 can be used in either an omni-directional mode, as illustrated by the circular coverage areas 116a, or a directional mode, e.g., using beam steering, as illustrated by the narrow beam coverage areas 116b. In either case, the low-rate channel 116 is a symmetric channel. FIG. 4b depicts a device coordinator 112 and a client device communicating over a high-rate channel 118. The high-rate channel 118 is an asymmetric directional channel as depicted by the narrow beam coverage areas of FIG. 4b. In one embodiment, a directional low rate channel is used in conjunction with the asymmetric directional high rate channel for communication of ACKs, etc., from the data receiving device to the data transmitting device indicating whether the data is successfully received or not.

In one embodiment, the low-rate channel uses OFDM (orthogonal frequency division multiplexing) in both the omni-directional and directional modes. However, any transmission protocol may be used, including, for example, code division multiple access (CDMA) frequency division multiple access (FDMA) system, time division multiple access (TDMA), frequency hopping, etc. The low-rate channel omni-directional mode is used for transmission of control data such as beacon messages (discussed below), network/device association and disassociation, device discovery, acknowledgements, device capability and preference exchanges, etc. The low rate channel directional or beamformed mode can be used for communicating audio signals and/or compressed video signals. The low-rate channel directional mode is not as reliable due to frequently changing channel conditions including blockages by objects such as people, furniture, walls, etc. For this reason, the omni-directional mode is used for the majority of control signals since it is more reliable, covers all directions whereby movement of the receiver and/or transmitter has less effect on the ability to maintain a connection. The low-rate channel omni-directional mode offers data rates in a range from about 2.5 Mbps to about 10 Mbps. The low-rate channel directional mode offers data rates in a range from about 20 Mbps to about 40 Mbps. However, other data rates are envisioned as being possible.

The directional modes of the low-rate and high-rate channels can be used for multiple simultaneous connections between devices since the transmission beams are narrow and may not adversely affect one another. However, the low-rate channel omni-directional transmissions (as depicted by the circular coverage areas 116a in FIG. 4a) can interfere with any device coordinator 112 or client device 114 within range. For this reason, the low-rate channel omni-directional transmissions are time division duplexed with the directional transmissions (both low-rate and high-rate). Time division duplexing of low-rate channel omni-directional transmissions and the high-rate channel directional transmissions will now be discussed.

Many time division duplexing (TDD) channel access control schemes known to those in the art can be used to coordinate transmissions of the low-rate and high-rate channels within a network. The goal of the TDD scheme is to only have one of the two channels, low-rate or high-rate, being transmitted on at any one time. An example of a channel access control scheme used to coordinate the low-rate and high-rate channels is a superframe-based scheme. FIG. 5a is an illustration of a sequence of superframes and a breakdown of an example of a superframe time period that may be used in a wireless network such as illustrated in FIG. 1. In a superframe base transmission system, the transmission time is broken into a series of superframes 500. The length of time of the superframe is made small enough to allow for frequent medium access control (this cuts down on delays in processing control signals that enable access), but is made long enough to provide for efficient throughput of uncompressed video data. Large delays in processing user commands, such as on/off, channel switch, volume change, etc., will negatively affect the user experience. For these reasons, a superframe time is typically in a range from about 16 msec to about 100 msec.

In the example superframe scheme shown in FIG. 5a, each superframe is divided into three main time frames, a beacon frame 505, a control period frame 510 and a frame for reserved and unreserved channel time blocks (CTB's) 515. The time frame 515 for reserved and unreserved CTB's is herein referred to as the CTB frame 515. The beacon frame is used to set the timing allocations for the reserved and unreserved CTBs of the CTB frame 515. A device coordinator 112, such as a TV set, for example, communicates reserved time slots to the multiple client devices 114 in a network such as the network 100 in FIG. 1.

The control period frame 510 is used to allow client devices to transmit control messages to a device coordinator. Control messages may include network/device association and disassociation, device discovery, time slot reservations, device capability and preference exchanges, etc. The control period frame 510 may use a contention based access system such as Aloha, slotted Aloha, CSMA (carrier sensed multiple access), etc., to allow multiple devices to send control messages and to handle collisions of messages from multiple devices. When a message from a client device is received at a device coordinator without suffering a collision, the device coordinator can respond to the request of the message in the beacon frame 505 of a subsequent superframe 500. The response may be a time slot reservation of a CTB in one or more subsequent superframes 500.

The CTB frame 515 is used for all other transmissions other than beacon messages and contention based control messages which are transmitted in the beacon frame 505 and the control frame 510. Reserved CTBs are used to transmit commands, isochronous streams and asynchronous data connections. CTB's can be reserved for transmission by a coordinator device to a specific client device, for transmission by a client device to a device coordinator, for transmission by a client device to another client device, etc. A CTB can be used to transmit a single data packet or multiple data packets. A CTB frame can include any number of reserved or unreserved CTB's. Unreserved CTB's in the CTB frame 510 can be used for communication of further contention based commands on the low-rate channel such as remote control commands (e.g., CEC and AVC commands), MAC control, and management commands.

It is desirable to make the length of the control frame 510 as small as possible while still allowing many client devices to be able to successfully access the network without undue time delay, e.g., due to message collision. In one embodiment, the only messages that are sent on a contention basis are control initiation request messages that identify a requesting device and a type of message sequence exchange to be scheduled in a reserved CTB. In this way, the size of the messages that are contention based are kept to a minimum. All other message exchanges on the low-rate channel can be scheduled.

In order for a message of a client device to be identified by a receiving device coordinator, a preamble is used at the start of a contention based message. The preamble is a predetermined bit sequence that can be identified by the device coordinator (or any receiving device). Carrier sensing is particularly difficult in the 60 GHz frequency range and the length of the preamble may be in a range from about 30 microseconds to about 75 microseconds. Such long preambles make it very difficult to keep the control frame 510 to a desired short time duration. It can be envisioned that with many client devices, there could be a large number of collisions occurring in the control period 510, especially if the data being communicated is large, such as in a device capability message. Therefore, an efficient method of processing control messages is needed. In embodiments where the preamble is in a range from about 30 microseconds to about 75 microseconds, the length of the control frame 510 may be in a range from about 100 to about 600 microseconds.

FIG. 5b is an illustration of an example of time division duplexing of the low and high rate channels illustrated in FIG. 3 within a superframe period. FIG. 5b shows which channels can be used for transmission in the various superframe subframes shown in FIG. 5a. In one embodiment, only the low-rate channel 116 is used for transmission during the beacon frame 505, and the control frame 510. Both the high-rate and low-rate channels can be used for transmission during the CTB frame 515. Any of the beacon frame 505, the control frame 510 and the CTB frame 515 can have either fixed or variable durations, depending on the embodiment. Likewise, the superframe 500 time duration can be fixed or variable, depending on the embodiment.

As discussed above, carrier sensing of wireless transmissions in certain frequency spectrums (e.g., the 60 GHz spectrum) may require long duration preambles on the order of 30 microseconds to 75 microseconds or more when using the omni-directional mode as is used for control message communication on the low-rate channels 116. Since the time of use of the low-rate channel 116 directly impacts the amount of time that the more efficient time division duplexed high-rate channel can be used, it is desirable to have transmission on the low-rate channels as efficient as possible. In general, the control data packets (e.g., ACKs, MAC commands, and AVC commands, etc.) that are transmitted over the low-rate channel 116 in omni-directional mode are very small, which increases the inefficiency of the corresponding data packets due to the large preamble. The format of information packets sent on the high rate channel can result in inefficient numbers of ACK messages that are transmitted on the low rate channel.

FIG. 6a is an illustration of an example of time division duplexing of the low and high rate channels illustrated in FIG. 3 within a superframe period, where individual packets of multimedia data are communicated over the high rate channel and individual acknowledgements are communicated on the low rate channel. The high rate channel 600 is used for directional transmission of multimedia data including, for example, uncompressed video data 610, audio data 615 and control data 620. The number of data packets in this example is arbitrarily set to three. More or fewer data packets may be transmitted during a superframe. More types of data than those shown may also be transmitted, such as extraneous data files, for example. The various multimedia data 610, 615 and 620, in this example, are transmitted in individual packets in reserved CTB's of the superframe. Each individual data packet 610, 615 and 620 is acknowledged to have been received, or not received, by three individual ACK packets 625. The ACK packets 625 are transmitted on the low rate channel 605 by the receiving device after receiving the video data packet 610, the audio data packet 615 and the control data packet 620. Each of the ACK packets 625 comprises a preamble and one or more acknowledgement bits. In one embodiment, the acknowledgement bit is set to one if the data packet is received correctly and is set to zero if the data packet is not received or received incorrectly. Since each of the ACK packets 625 includes a lengthy preamble, lengthy compared to the ACK bit(s), the time taken away from the high rate channel 600 to transmit the ACK packets 625 on the low rate channel 605 can be significant.

For transmitting the same amount of information, the transmission duration over the high-rate channel is significantly shorter than that over the low-rate channel. After a data packet is transmitted from one device to another device on the high-rate channel, an ACK packet 625 is feedback from device 2 to device 1 on the low-rate channel to allow for retransmission of an erroneous or not received data packet as soon as possible. Some time interval is required for the switching between receiving on the high-rate channel 600 and receiving on the low-rate channel 605. Frequent channel switching could degrade the network throughput since no data can be transmitted during the channel switching time. To reduce the overhead caused by ACK packets and switching between high-rate and low-rate channels, an approach using aggregation of different kinds of information such as control frame, audio, data, and video into one packet is introduced. The packet is called an HR (high-rate) composite packet. This more efficient method of transmitting multimedia data on the high rate channel 600 and of transmitting the corresponding ACK frames on the low rate channel 605 will now be discussed.

FIG. 6b is an illustration of another example of time division duplexing of the low and high rate channels illustrated in FIG. 3 within a superframe period, where a composite packet of multimedia data is communicated over the high rate channel and a composite acknowledgement is communicated on the low rate channel. In this example, a single composite packet 630 comprising three subpackets 635, 640 and 645, is transmitted on the high rate channel 600. The subpackets 635, 640 and 645 contain uncompressed video data, audio data and control data, respectively. The number of subpackets in this example is arbitrarily set to three. More or fewer subpackets may be transmitted in a single composite packet 630 during a superframe. More types of data than those shown may also be transmitted, such as extraneous data files, for example. Instead of transmitting three individual ACK packets 625, as illustrated in FIG. 6a, a single composite ACK packet 650 is transmitted by the receiving device on the low rate channel 605. The composite ACK packet 650 comprises a preamble similar to that of the individual ACK packets 625 of FIG. 6a. However, the composite ACK packet 650 includes an ACK group field. The ACK group field comprises a plurality of bits that are used to acknowledge the subpackets 635, 640 and 645. Efficiency is improved in the example of FIG. 6b compared to that of FIG. 6a since the composite ACK packet 650 has only one preamble compared to the three preambles needed for the individual ACK packets 625. In addition the efficiency is further improved since the channel switching between the high rate channel 600 and the low rate channel 605 is reduced from five transitions as illustrated in FIG. 6a to one transition as illustrated in FIG. 6b.

Figure 7:
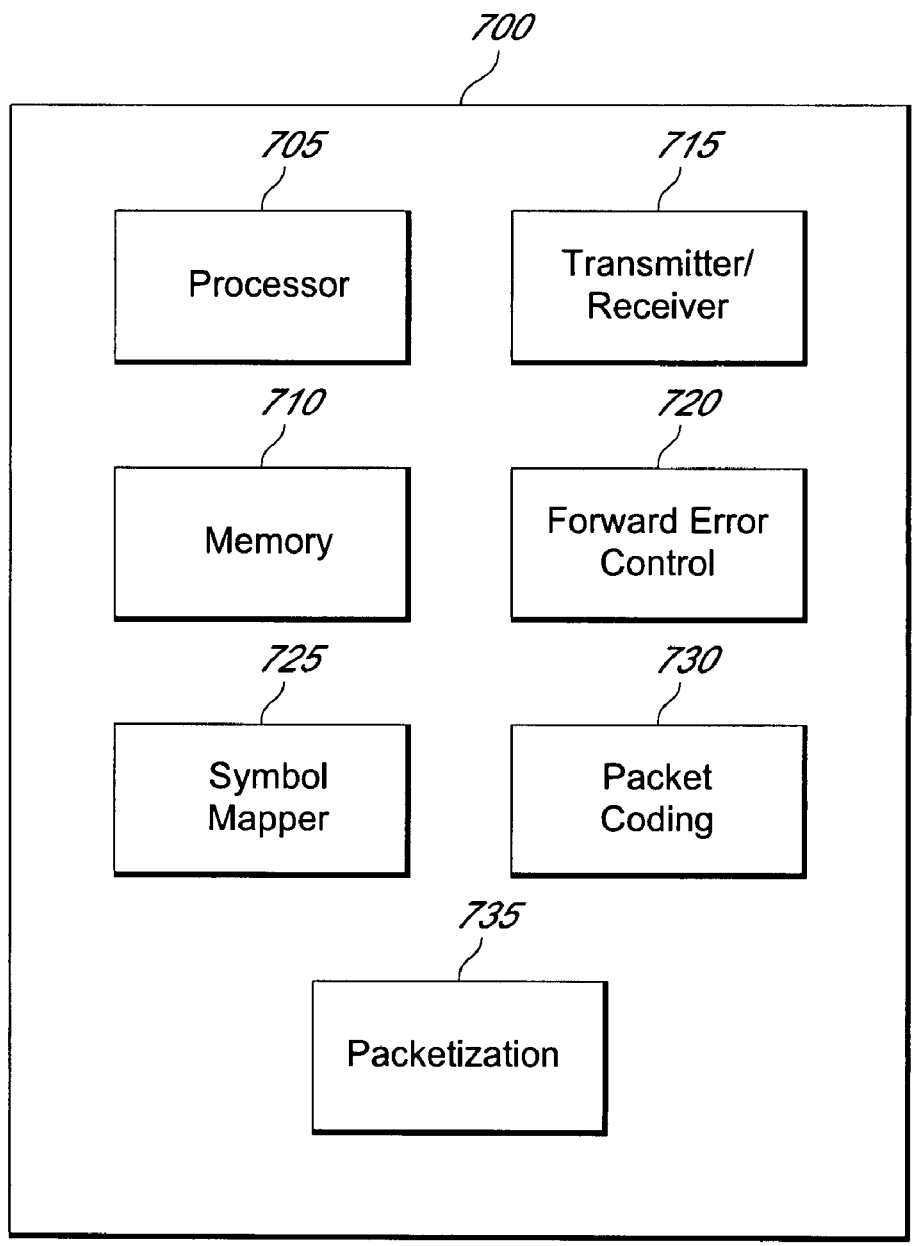
FIG. 7 is a block diagram illustrating an embodiment of a wireless transmitter that may be used in a communication system such as illustrated in FIG. 2.

FIG. 7 is a block diagram illustrating an embodiment of a wireless transmitter 700 that may be used in the communication system 200 as illustrated in FIG. 2. In this embodiment, the wireless transmitter 700 is configured to transmit composite packets of multimedia data as illustrated in FIG. 6b. The wireless transmitter 700 comprises a processor element 705, a memory element 710, a transmitter/receiver (or transceiver) subsystem 715, a forward error control subsystem 720, a symbol mapper subsystem 725, a packet coding subsystem 730, and a packetization subsystem 735. The processor 705 may include one or more of a general purpose processor and/or a digital signal processor and/or an application specific hardware processor. The memory 710 may include, for example, one or more of integrated circuits or disk based storage or any readable and writeable random access memory device. The processor 705 is coupled to the memory 710 and the other elements to perform the various actions of the other elements. In reference to FIG. 1, the transceiver subsystem 715 transmits and receives data to and from other devices in the network 100, such as the client devices 114 and the device coordinator 112. The transceiver subsystem 715 is configured to transmit the composite packets of multimedia data over the high rate channel 118 and to receive the corresponding composite acknowledgment packets over the low-rate channel 116 as discussed above in reference to FIG. 6b.

The forward error control (FEC) subsystem 720 is configured to provide protection against errors during wireless data transmission. The FEC subsystem 720 adds redundant data to the data input to the FEC element 720. The redundant data allows the receiver to detect and correct errors without asking the transmitter for additional data. In adding redundant data to the video data, the FEC subsystem 720 can use error-coding encoders, such as a Reed-Solomon (RS) encoder and a convolutional code (CC) encoder. In other embodiments, the FEC subsystem 720 may use various other encoders, including, but not limited to, a Golay encoder, a Hamming encoder, and a Bose, Ray-Chaudhuri, Hocquenghem (BCH) encoder. In cases where the composite packet comprises a plurality of subpackets, the FEC 720 adds redundant data to one or more subpackets. The FEC subsystem 720 is configured to use different FEC schemes for the different subpackets. In this way, more critical data may be protected with more robust FEC schemes and less critical data may be protected with less robust schemes. In some embodiments, the multiple FEC schemes may include Unequal Error Protection (UEP) schemes and Equal Error Protection (EEP) schemes. UEP schemes typically use different FEC schemes for different portions of data, whereas EEP schemes use the same FEC scheme for all portions of data. UEP schemes may use a first FEC scheme for the most significant bits and may use a second FEC scheme for the least significant bits. Other forms of UEP know to skilled technologists may also be used.

The symbol mapper subsystem 725 maps data bits to complex (IQ) symbols (frequency domain data). The complex symbols are used to modulate a carrier for the wireless transmission described above. The mapper 830 can use various modulation schemes, including, but not limited to, Binary Phase-Shift Keying (BPSK), Quadrature Phase-Shift Keying (QPSK), and Quadrature Amplitude Modulation (QAM). In one embodiment, the mapper 725 is a QAM mapper, for example, a 16-QAM mapper or 64-QAM mapper. QAM is a modulation scheme which conveys data by modulating the amplitude of two carrier waves. The two waves, usually sinusoids, are out of phase with each other by 90° and thus are called quadrature carriers. The number, 16 or 64, in front of "QAM" refers to the total number of symbols to which the mapper can map groups of data bits. For example, a 16-QAM mapper converts 4-bit data into $2^4$=16 symbols. Typically, for QAM mappers, a constellation diagram is used for representing such symbols. The mapper 725 is configured to use different modulation schemes for the different subpackets. In this way, more critical data may be protected with more robust modulation schemes and less critical data may be protected with less robust schemes.

The packet coding subsystem 730 encodes various fields containing information related to the contents of the data packets including, but not limited to, the composite data packets and corresponding subpackets. The fields may include header portions, tail portions and other packet fields known to skilled technologists. Details of the various fields encoded by the packet coding subsystem 730 will be discussed below.

The packetization subsystem 735 combines the different parts of the packets (e.g., composite packets and regular packets) to form the packet. The different parts that are combined may include one or more header or tail portions, one or more packet body portions, a plurality of subpacket portions in the case of the composite packets, and one or more CRC data portions corresponding to FEC schemes used for one or more portions of the packet. Details of the functions performed by the packetization subsystem 735 will be discussed below.

In some embodiments, one or more of the elements and/or subsystems of the wireless transmitter 700 of FIG. 7 may be rearranged and/or combined. The elements and/or subsystems may be implemented by hardware, software, firmware, middleware, microcode or any combination thereof. Details of the actions performed by the elements and/or subsystems of the wireless transmitter 700 will be discussed in reference to the methods illustrated in FIGS. 10a and 10b below.

Figure 8:
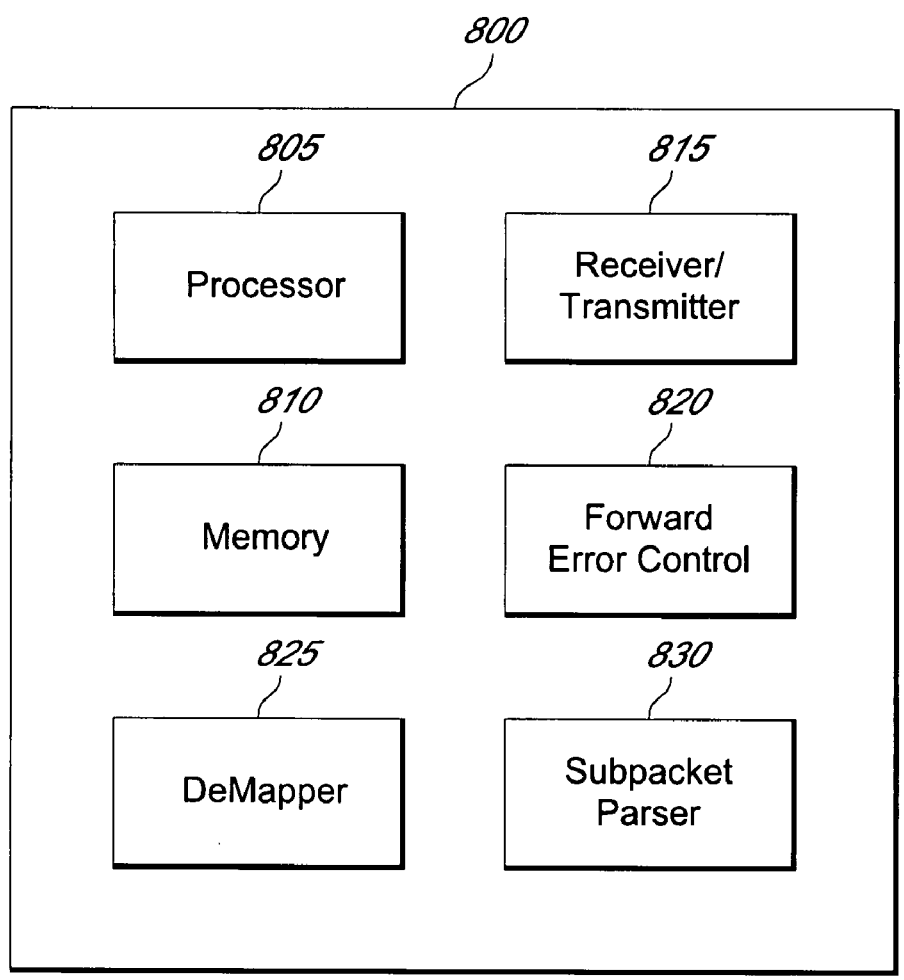
FIG. 8 is a block diagram illustrating an embodiment of a wireless receiver that may be used in a communication system such as illustrated in FIG. 2.

FIG. 8 is a block diagram illustrating an embodiment of a wireless receiver that may be used in the communication system 200 as illustrated in FIG. 2. In this embodiment, the wireless receiver 800 is configured to receive composite packets of multimedia data as illustrated in FIG. 6b. The wireless receiver 800 comprises a processor element 805, a memory element 810, a transmitter/receiver (or transceiver) subsystem 815, a forward error control decoder subsystem 820, a symbol demapper subsystem 825, and a subpacket parser subsystem 830. The processor 805 may include one or more of a general purpose processor and/or a digital signal processor and/or an application specific hardware processor. The memory 810 may include, for example, one or more of integrated circuits or disk based storage or any readable and writeable random access memory device. The processor 805 is coupled to the memory 810 and the other elements to perform the various actions of the other elements and/or subsystems. The wireless receiver 800 subsystems perform an inverse process of that of the transmitter 700 of FIG. 7. In reference to FIG. 1, the transceiver subsystem 815 transmits and receives data to and from other devices in the network 100, such as the client devices 114 and the device coordinator 112. The transceiver subsystem 815 is configured to receive the composite packets of multimedia data over the high rate channel 118 and to transmit the corresponding composite acknowledgment packets over the low-rate channel 116 as discussed above in reference to FIG. 6b.

The FEC decoder subsystem 820 decodes the various portions of the composite packets in relation to the redundant FEC data added by the FEC subsystem 720 of the transmitter 700. The FEC decoder 820 detects and corrects errors in the various portions of the composite packet depending on the FEC scheme used to encode the various portions. The FEC decoder 820 also calculates CRC value(s) based on the decoded portion(s) (e.g., the portion on which error detection and correction was performed) of the packet that the transmitter-appended CRC(s) corresponded to. If the receiver-calculated CRC agrees with the transmitter-appended CRC, then a positive acknowledgement may be transmitted by the transceiver 815 to the transmitter device. If the CRC's do not agree, then no acknowledgement may be sent, or a negative acknowledgement may be sent, depending on the embodiment.

The demapper subsystem 825 converts or demaps the complex frequency domain data back into the datastream bits that the symbol mapper 725 mapped. The demapper 825 is configured to demap the subpackets in different ways corresponding to the modulation schemes used to modulate the different subpackets. Demapping techniques known to skilled technologists can be used to demap any of the modulation schemes discussed above in relation to the symbol mapper 725 of FIG. 7.

The subpacket parser subsystem 830 parses the correctly received subpackets and forwards them to the various higher layer applications to which they are targeted. For example, subpackets containing compressed video may be forwarded to a video decoder, subpackets containing uncompressed video may be forwarded to a HDTV display device, subpackets containing audio may be forwarded to an audio decoder and control subpackets may be forwarded to a multimedia control application.

In some embodiments, one or more of the elements and/or subsystems of the wireless receiver 800 of FIG. 8 may be rearranged and/or combined. The elements and/or subsystems may be implemented by hardware, software, firmware, middleware, microcode or any combination thereof. Details of the actions performed by the elements and/or subsystems of the wireless receiver 800 will be discussed in reference to the method illustrated in FIG. 11 below.

Figures 9A, 9B:
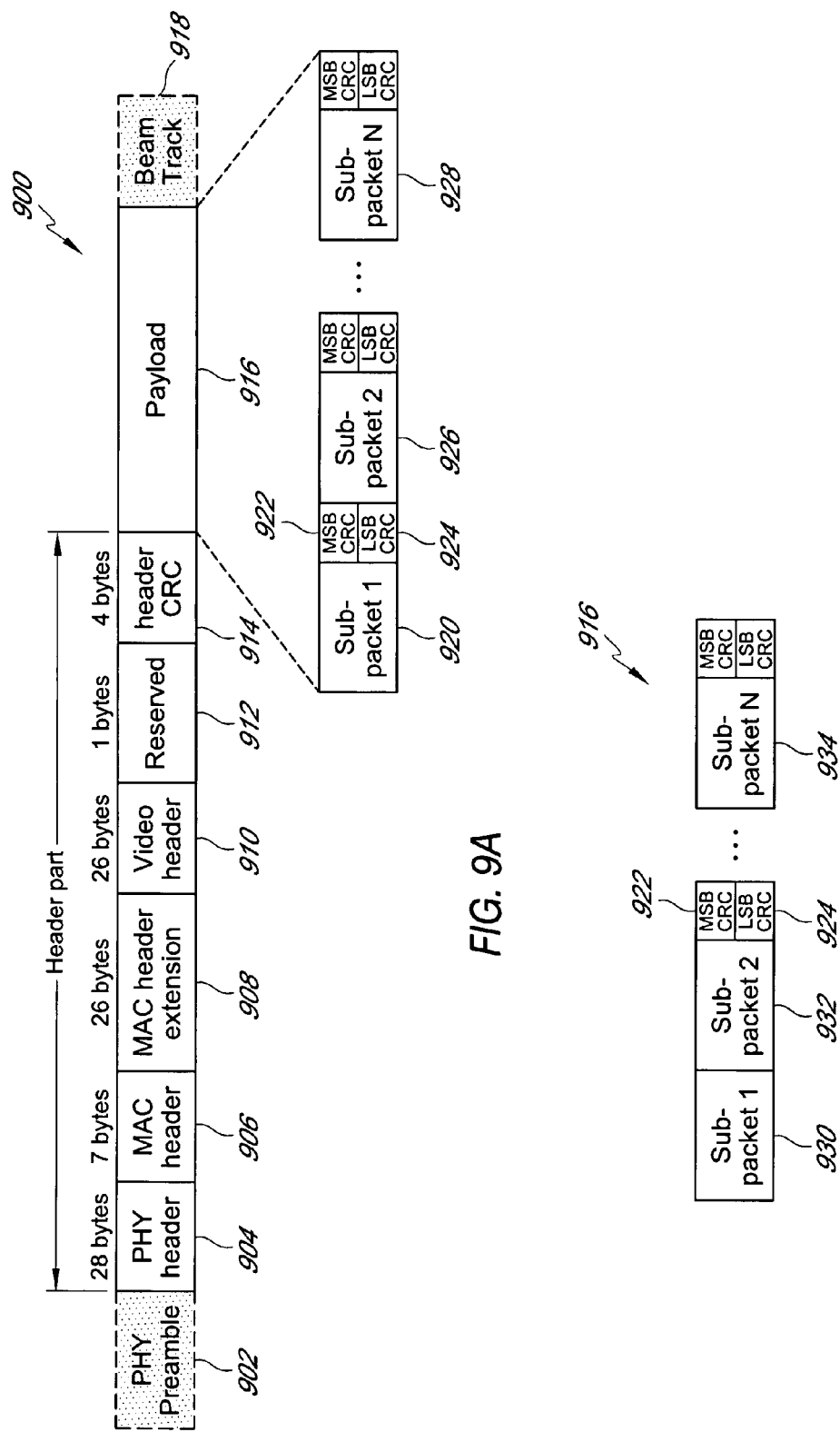
FIG. 9a shows various fields in an example of a composite packet of multimedia data used in a system such as illustrated in FIGS. 1 and 2.
FIG. 9b shows various fields in another example of a composite packet of multimedia data used in a system such as illustrated in FIGS. 1 and 2.

FIG. 9a shows various fields in an example of a composite packet 900 of multimedia data used in a system such as illustrated in FIG. 2. The composite packet 900 is transmitted on the high rate PHY channel and is referred to as the HRP composite packet 900. The HRP composite packet 900 includes a physical layer (PHY) preamble 902. The preamble 902 precedes the remaining data in the composing packet 900, wherein the preamble includes a set of short training sequences. Every packet has a preamble that precedes a packet header. Processing of the preamble is performed in the PHY layer.

In this example, the packet header includes a PHY header 904, a MAC header 906, a MAC header extension 908, a video header 910, a reserved portion 912 and a CRC (Cyclic Redundancy Check) for the whole header. Various portions of the composite packet can be modulated and coded using various modulation and coding schemes (MCS). The MCS modes may include EEP (Equal Error Protection) modes and UEP (Unequal Error Protection) modes. EEP modes use the same coding rate and modulation (e.g., QPSK or 16-QAM) QAM) for both most significant bits (MSBs) and least significant bits (LSBs). Some coding modes may only provide error protection for the MSBs. In one embodiment, the whole header is transmitted using the most reliable MCS and also employs EEP for both the MSBs and the LSBs. Since the header contains information needed to decode the entire composite packet, using the most reliable MCS provides a better chance of the header being received error free. Higher coding rates provide for more robust transmission at the expense of the data rate that can be handled on the HRP. For example, a coding rate of 1/3 with QPSK modulation provides half the data rate that a coding rate of 2/3 with QPSK would provide. UEP modes protect the MSBs (bits 7, 6, 5 and 4 for example) with a higher coding rate than the LSBs (bits 3, 2, 1 and 0 for example). Thus the bits representing the largest percentage of the signal are given more robust protection. Coding efficiency can be increased if adjacent subpackets share a common MCS. In this way, the PHY of the transmitter as well as the receiver does not have to transition from one MCS to another, and there is no MCS switch delay.

The HRP composite packet 900 also includes a payload portion 916. The payload portion 916 comprises N sub-packets 920, 926 and 928 in this example. The number of sub-packets N may be a fixed maximum number such as 2, 3, 4, 5, 6, 7, 8 or more, for example. In some embodiments, the different sub-packets can use different HRP MCS modes for transmission. As discussed above, the MCS modes may include EEP and/or UEP or MSB-only coding modes. In the example shown in FIG. 9a, each subpacket 920, 926 and 928 has one CRC 922 for the MSBs and another CRC 924 for the LSBs. In other examples, a subpacket may have only a single CRC for both the MSBs and LSBs. In some embodiments, each of the subpackets contains only one type of data, such as, for example, audio, video, text or other data (e.g., file downloads).

The final field in the HRP composite packet 900 is a beam track field 918. The beam track field 918 is used for periodic beam tracking to keep stable transmission quality. This field may not be included in every composite packet.

FIG. 9b shows various fields in another example of a composite packet of multimedia data used in a system such as illustrated in FIG. 2. The fields shown in FIG. 9b include N subpackets 930, 932 and 934 of the payload portion 916. In this example the, the subpackets 930 and 932 share a pair of CRCs 922 and 924 for the MSBs and LSBs, respectively. Thus, the CRCs 922 and 924 are calculated based on the contents of both the subpackets 930 and 932 in this example. The subpacket 930 may include audio while the subpacket 932 may include video. Since the two subpackets 930 and 932 share a CRC in this example, they share a common coding mode. By sharing the CRC's between two or more subpackets, a larger number of subpackets N may be provided for by a smaller number of ACKs. As discussed above, a single CRC may also be used for both MSBs and LSBs.

Figure 9C:
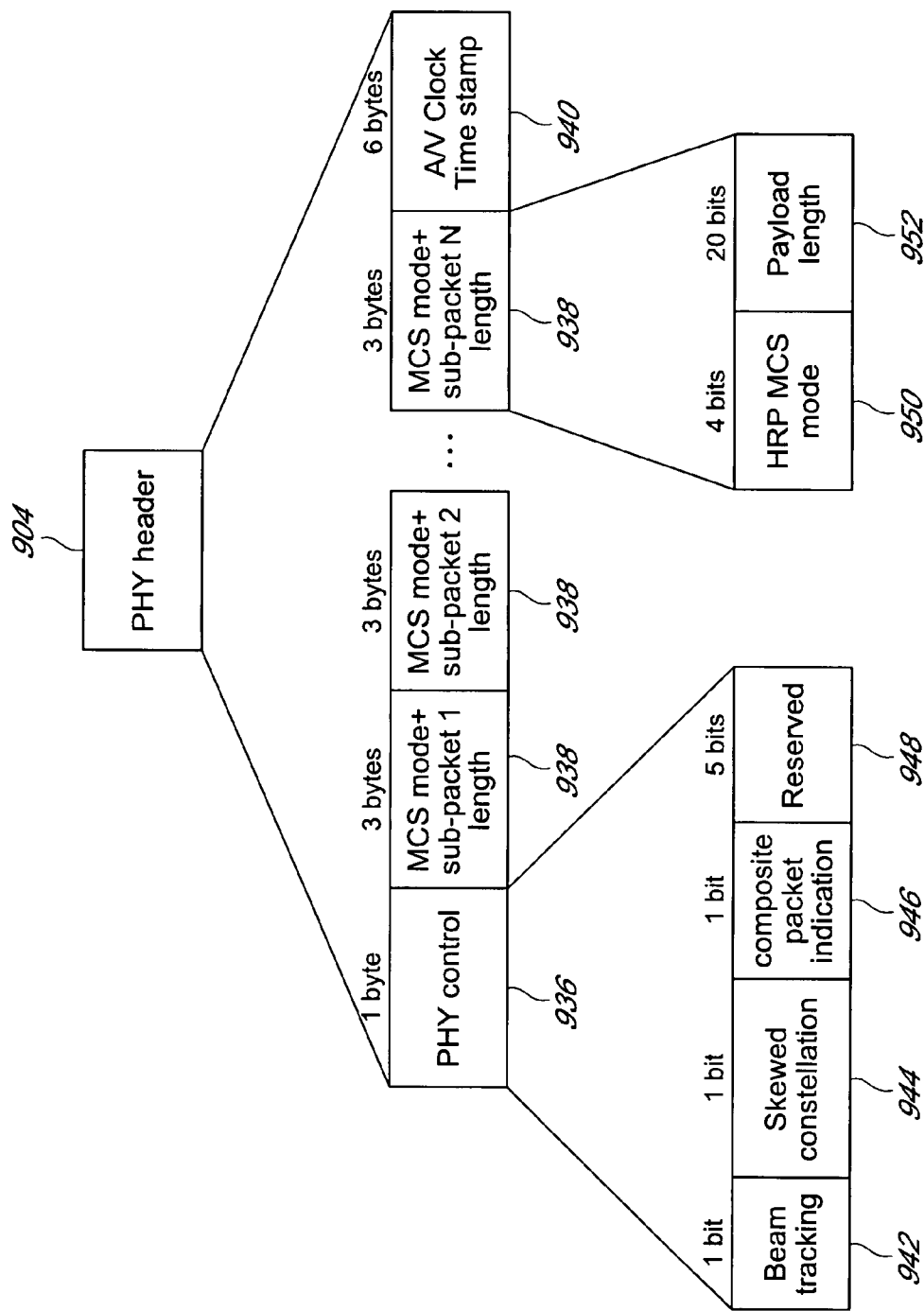
FIG. 9c shows various subfields in the PHY header field of the composite packet of FIG. 9a in one embodiment.

Details of the header portion of the composite packet 900 will now be discussed. FIG. 9c shows various subfields in the PHY header field 904 of the composite packet 900 of FIG. 9a in one embodiment. The PHY header field 904 is comprised of a PHY control field 936, N subpacket description items 938 (one for each of the N subpackets in this example) and an A/V clock Timestamp 940. The PHY control field 936 is comprised of one byte including a beam tracking bit 942, a skewed constellation bit 944, a composite packet indication bit 946 and 5 reserved bits 948 that can be used for other uses. For example, in embodiments where the number of subpackets is not a fixed number, the reserved bits 948 can be used to indicate the number of subpackets (and the number of sub-packet description items 938 The beam tracking bit is used to indicate whether the beamtrack information field 918 shown in FIG. 9a will be included in this composite packet. The skewed constellation bit 944 is used to indicate whether a UEP modulation scheme including a skewed modulation mapping is used or not. The skewed constellation provides another layer of UEP in addition to simply using different coding schemes for the MSBs and LSBs. In the skewed constellation form of UEP, different symbols are afforded different signal to noise ratios in order to provide the UEP. The composite packet indication bit 946 is used to indicate whether the packet is an HRP composite packet or not.

Each of the subpacket description items 938 includes an HRP MCS mode field 950 (4 bits in this example) and a subpacket length field 952 (20 bits in this example). The HRP MCS mode field 950 is used to indicate which HRP MCS mode is used for error control coding and modulating the corresponding sub-packet in the payload portion 916 of the composite packet 900. As discussed above there are different MCS modes including, for example, EEP, UEP or UEP MSB only coding as well as different modulation schemes. Sub-packets in a composite packet may be encoded using any MCS mode. For example, sub-packet packet MCS can be ordered from most robust to least robust or vice-versa. In some embodiments, as discussed above, sub-packets using the same MCS are kept together (adjacent) in the PHY bit-stream to reduce the data padding overhead caused by symbol boundaries with different MCS modes. Each of the subpacket description items 938 also includes a 20 bit Sub-packet length used to indicate the sub-packet length in the payload portion 916 including the CRC fields 922 and 924. The ANV clock timestamp field 940 may include, for example, two clock timestamps that are used for synchronization of audio and video clocks for the audio and video contained in the sub-packets. Video to be displayed in a frame at a certain time may be spread out over several composite packets (along with the synchronized audio data), in which case, the AV clock timestamp fields 940 for the several subpackets may be the same.

Figure 9D:
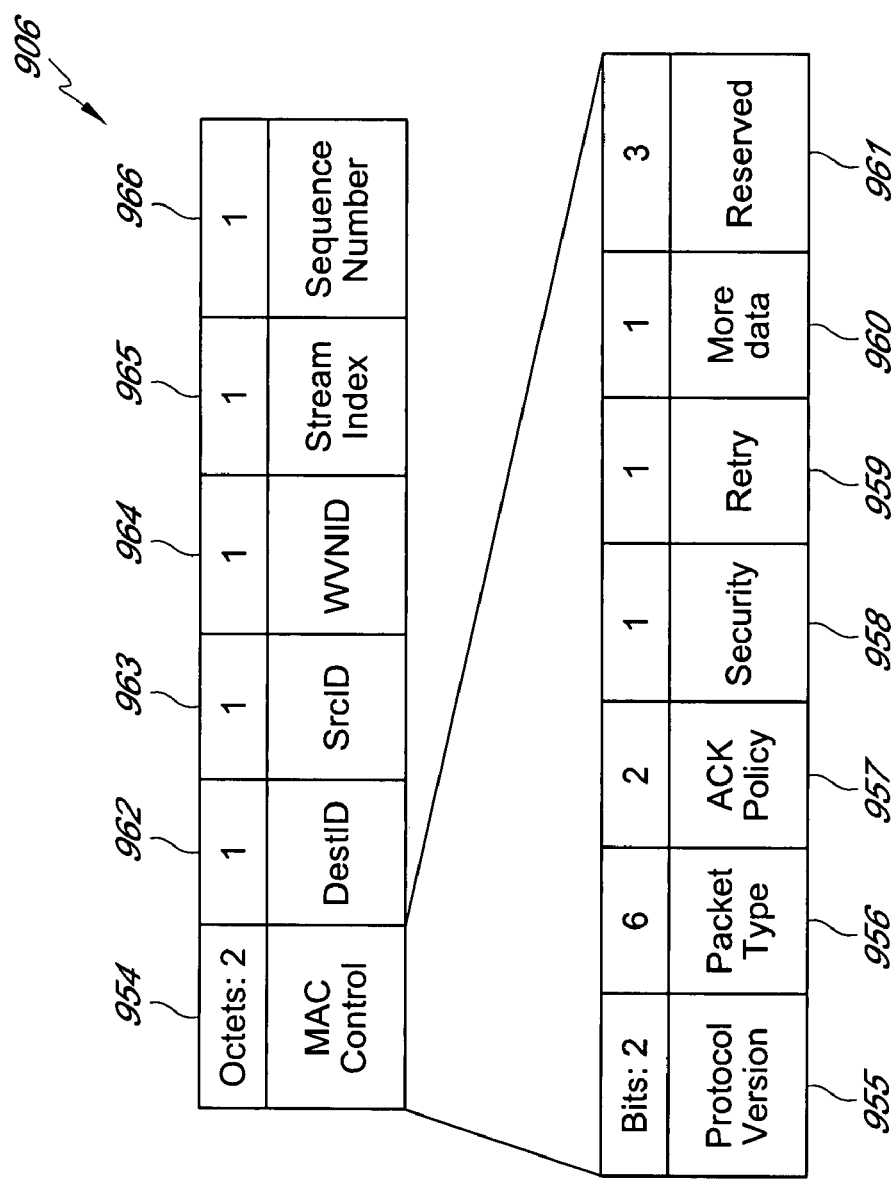
FIG. 9d shows various subfields in the MAC header field of the composite packet of FIG. 9a in one embodiment.

Details of the MAC header field 906 of the composite packet 900 will now be discussed. FIG. 9d shows various subfields in the MAC header field 906 of the composite packet 900 of FIG. 9a in one embodiment. A MAC control field 954 comprises subfields including a protocol version field 955, a packet type field 956, an ACK policy field 957, a security bit 958, a retry bit 959, a more data bit 960 and reserved bits 961.

The protocol version field 955 indicates the revision of the protocol used for the packet. The protocol version field comprises 2 bits in this example and is used to allow upgraded protocol revisions. The packet type field indicates the type of packet. Certain values of the packet type field may indicate a message as being an ACK message, a control command, a beacon message, a MAC command, etc. The ACK policy field 957 is used to indicate whether the packet requires an ACK message to be transmitted from the receiving device in response to receiving the packet. The security bit 958 can be set to one for secure packets (e.g., encrypted) and can be set to zero otherwise. The retry bit 959 can be set to one if the packet is a retransmission of a previously transmitted packet, otherwise it is set to zero. The more data bit can be set to one if the device will not be sending any more packets in the time block of the superframe in which it was transmitted, it can be set to zero otherwise. The reserved field 961 can be used for other purposes depending on the embodiment. In the example shown, the MAC control field is two octets long, but other lengths may be used depending on the embodiment.

The MAC header field 906 also includes a destination ID field 962, a source ID field 963, a wireless video area network ID (WVNID) field 964, a stream index 965 and a sequence number field 966. Each of the fields 962 to 966 is one octet long in this example, but they may all be longer or shorter, depending on the embodiment. The destination ID field 962 is set to the device identification number of the destination device. The source ID field 963 is be set to the device identification number of the device that sends the packet. The WVNID field 954 is set to the identification number of the wireless video area network in order to have multiple audio/video networks in the same general area. The stream index field 965 may be set to various values to identify the type of data stream that the packet is a part of such as, for example, an asynchronous data stream, a management traffic data stream, a bandwidth reservation traffic data stream, etc. Stream indexes can be assigned by a coordinator device for other purposes such as for creating data streams between client devices for any reason. The sequence number field 966 is a modulo 256 counter (in this example) that is incremented for each packet that is sent for a particular stream index. Each device in the network maintains a separate counter for each stream for which it is the source. It should be noted the fields of FIG. 9*d* may be rearranged, omitted and other fields not shown may also be added.

Figure 9E:
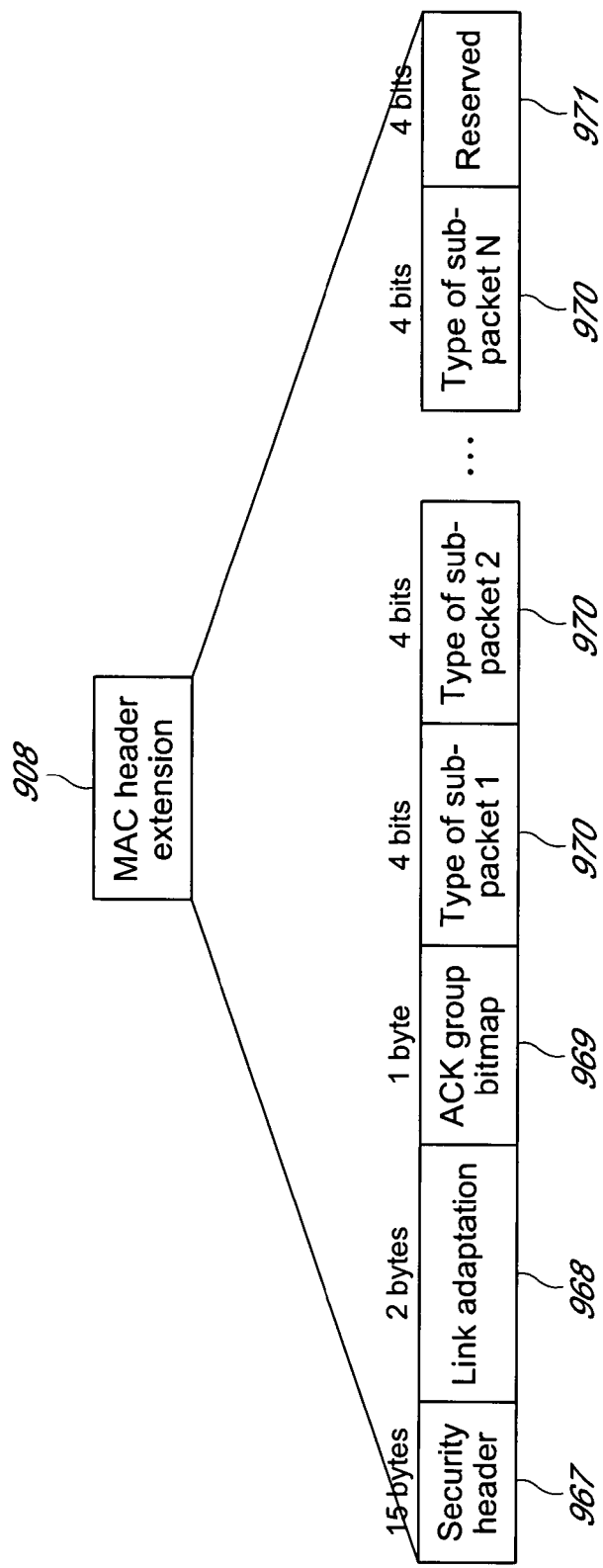
FIG. 9e shows various subfields in the MAC header extension field of the composite packet of FIG. 9a in one embodiment.

Details of the MAC header extension field 908 of the composite packet 900 of FIG. 9*a* will now be discussed. FIG. 9*e* shows various subfields in the MAC header extension field 908 of the composite packet 900 of FIG. 9*a* in one embodiment. A security header 967 is used to specify content protection/security schemes for the packet. The information included in this security header may indicate a cipher type, a key type, and copyright related information. The security header 967 may also include indications whether a Message Authentication Code and/or an initialization vector (IV) are included in the MAC header extension field 908. Copyright related information may include an indication if this packet is allowed to be copied or not. A Message Authentication Code may be used to check the integrity of the packet, to authenticate that the packet has not been modified by an attacker, etc. The IV (initialization vector) may be used by certain ciphers, such as an AES (advanced encryption standard) cipher with Counter Mode, to re-initialize and encrypt the packet. A Link adaptation field 968 is used to do link assessment and recommendation. Further details of the fields 967 and 968 are beyond the scope of this discussion.

An ACK group bitmap field 969 is used to indicate how to map N sub-packets to M ACK groups, where N is greater than or equal to M as discussed above. For example, N may be equal to seven and M may be equal to five. Limiting the number of ACK bits for a composite packet limits the traffic on the low rate channel for embodiments where the low rate channel and the high rate channel are time division duplexed as discussed above. For example, if only 5 ACK bits can be carried in a composite ACK packet, but the number of sub-packets is larger than the number of ACK bits, then multiple sub-packets may be mapped into one ACK group and use 1 ACK bit to tell the sender whether these sub-packets are received correctly or not. In one embodiment, each subpacket in an ACK group may have a corresponding CRC. In this embodiment, only if all CRCs are correct for all sub-packets within one ACK group, is the corresponding ACK bit of the ACK group set to "1". This may be implemented by applying an "AND" operation to the CRC calculation results of all sub-packets within one ACK group.

There are multiple methods to specify the bits in the ACK group field 969. One method involves the use of a single bit in a subpacket header that indicates that the subpacket is the start of an ACK group. This method is not as efficient as other options now discussed. The ACK group field 969 may use a string of continuous "1"s or "0"s to indicate the ACK groups. For example, 0011010 indicates that the first two sub-packets belong to one ACK group, the next two sub-packets belong to the next ACK group, the other three sub-packets each belong to there own different ACK groups. Another method uses a "1" to indicate the end of an ACK group and a "0" to indicate that there will be more sub-packets belonging to the same ACK group besides the current sub-packet. For example, 0101111 indicates that the first two sub-packets belong to the first ACK group, the next two sub-packets belong to the second ACK group, and the other three sub-packets belong to 3 separate ACK groups. Skilled technologist will be able to readily identify other methods of mapping ACK bits to sub-packets.

The MAC header extension field 908 of FIG. 9*e* also includes N type of sub-packet fields 970 used to indicate the type of the information in the sub-packet. The four bits in each of the fields 970, in this example, may be used to indicate a type of information that is contained in the corresponding subpacket. For example, a zero value may indicate uncompressed video, a one may indicate audio, a two may indicate data (such as text), a three may indicate control data, a four may indicate compressed video, etc. Field 971 contains reserved bits that may be used for other purposes know to skilled technologists.

Figure 9F:
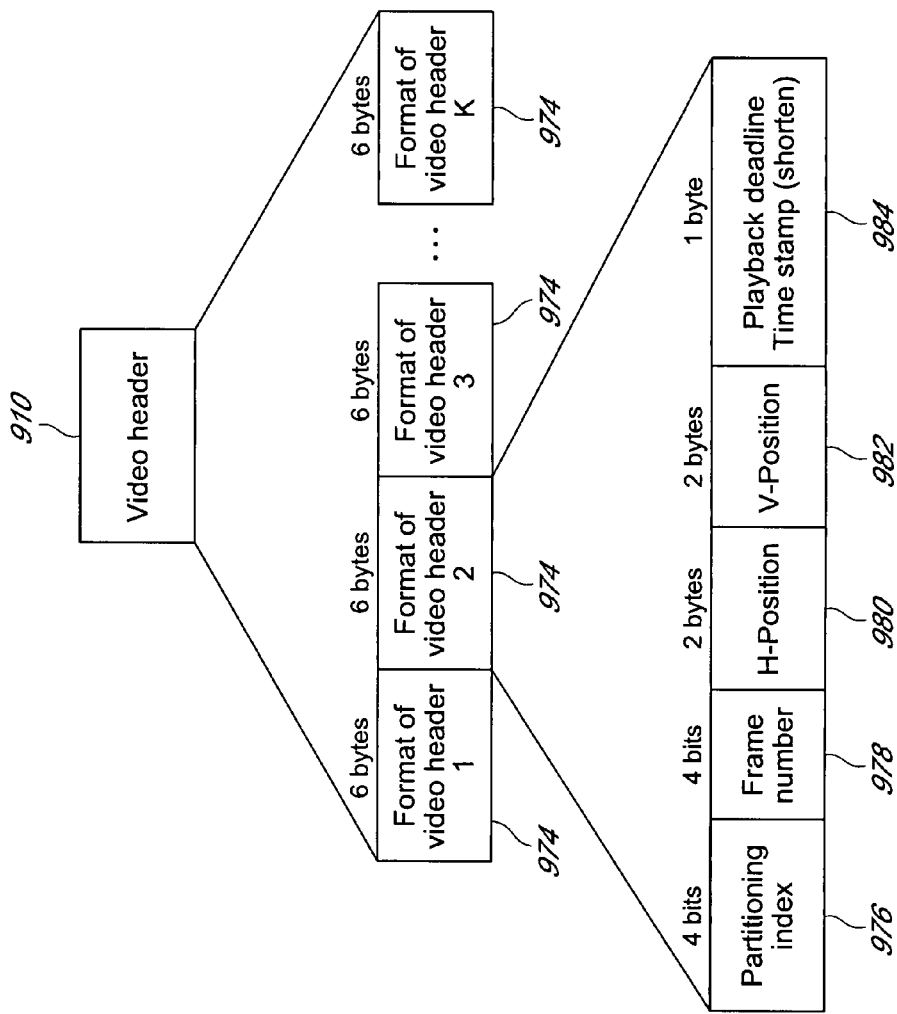
FIG. 9f shows various subfields in the video header field of the composite packet of FIG. 9a in one embodiment.

Details of the video header field 910 of the composite packet 900 of FIG. 9*a* will now be discussed. FIG. 9*f* shows various subfields in the video header field 910 of the composite packet of FIG. 9*a* in one embodiment. In the embodiment shown in FIG. 9*f,* all the video subpackets are grouped together in adjacent subpackets. This is done to enable the same MCS mode to be used for all the video. Since the uncompressed video comprises a large percentage of the packetized data, this adds efficiency to the encoding and decoding times as discussed above. The video header field 910 contains information that was usually put in the header of the video subpackets themselves. However, by moving this information to the header portion of the composite packet 900, the most robust EEP mode of the MCS modes may be used to protect the header information. In contrast, video data is typically protected with UEP modes which afford less protection to the detailed data in the LSBs. If EEP were used for the video subpackets, the information in the video header portion 910 could be moved to the video subpackets.

Each video sub-packet header 974 has a partitioning index field 976, a frame number field 978, a horizontal position field 980, a vertical position field 982 and a playback deadline timestamp field 984. The partitioning index field is used to tell which pixel partition is carried in the current sub-packet. The pixels are scrambled in the PHY layer such that neighboring pixels are separated into separate parts of the subpackets. Typically neighboring pixels are separated into separate subpackets by the partitioning method. The frame number field 978 indicates the sequence number of the video frame to which the current sub-packet belongs. Video is divided into horizontal and vertical lines. Each pixel in active video data can be represented in terms of a horizontal position (H-Position) and a vertical position (V-Position). The H-Position field 980 represents which horizontal line the first pixel of video data in the subpacket is located. The V-position field 982 represents which vertical line the first pixel of video data in the subpacket is located. The playback deadline timestamp 984 is used to indicate the deadline that the current sub-packet should be sent to the video display component.

It should be noted that the fields of the composite packet 900 shown in FIGS. 9*a* to 9*f* may be rearranged, omitted and combined. Methods of transmitting and receiving composite packets such as the composite packet 900 will now be discussed.

Figure 10A:
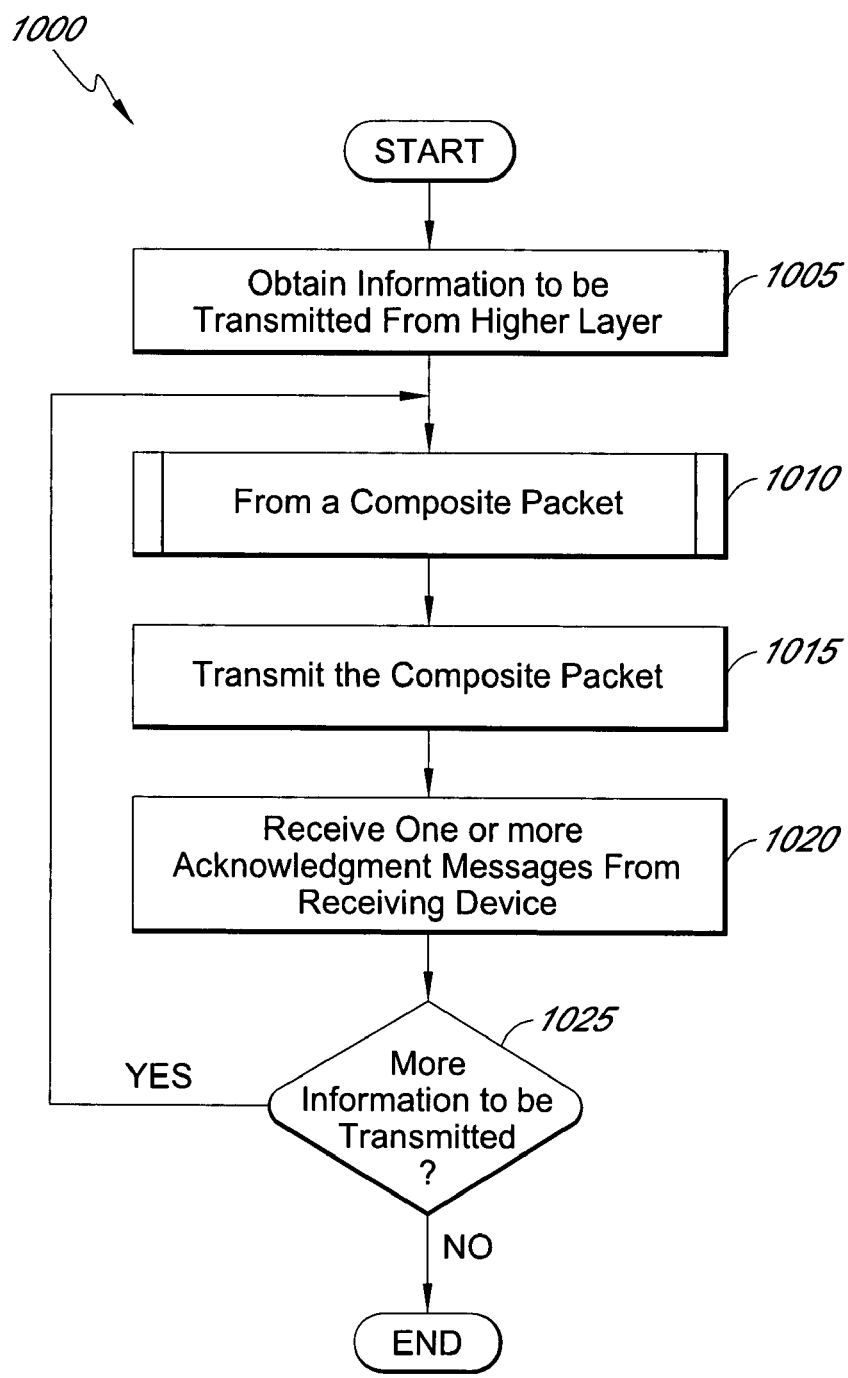
FIG. 10a is a flowchart illustrating an example of a method of transmitting composite packets of multimedia data in a system such as illustrated in FIGS. 1 and 2.

FIG. 10*a* is a flowchart illustrating an example of a method 1000 of transmitting composite packets of multimedia data in a system such as illustrated in FIG. 2. The method 1000 can be used to form composite packets such as the composite packet 900 shown in FIGS. 9*a* to 9*f.* However, other composite packet configurations may also be formed. The method 1000 also transmits the composite packets to a receiving device and may receive acknowledgement messages from the receiving device. The method 1000 can be performed in a wireless network by a transmitter device such as the wireless transmitter device 700 shown in FIG. 7. The method may also be performed over wireline networks or combination wireline and wireless networks.

The method 1000 starts at block 1005 where information to be transmitted in the composite packet is obtained, usually from higher layer applications. Applications may include multimedia applications including synchronized audio and video (compressed or uncompressed), still image applications, control applications, internet browser applications including textual and/or graphical data, etc. The information obtained at block 1005 may comprise synchronized streams of data such as audio/video, or there may be multiple independent streams of one or more types of data. The processor 705 of the wireless transmitter 700 may perform the functions of the block 1005.

After receiving the information to be transmitted at block 1005, the method 1000 continues to block 1010 where the transmitter device forms a composite packet from the plurality of streams of information obtained at the block 1005. A portion of two or more of the plurality of information streams are divided into two or more subpackets to be combined in the composite packet. A single information stream may be divided into multiple subpackets to be included in a single composite packet as discussed above. The forming of the composite packet may also include encoding of various header information such as the PHY header 904, the MAC header 906, the MAC header extension 908, the video header 910 and the header CRC field 914 as shown in FIGS. 9a to 9f.

Figure 10B:
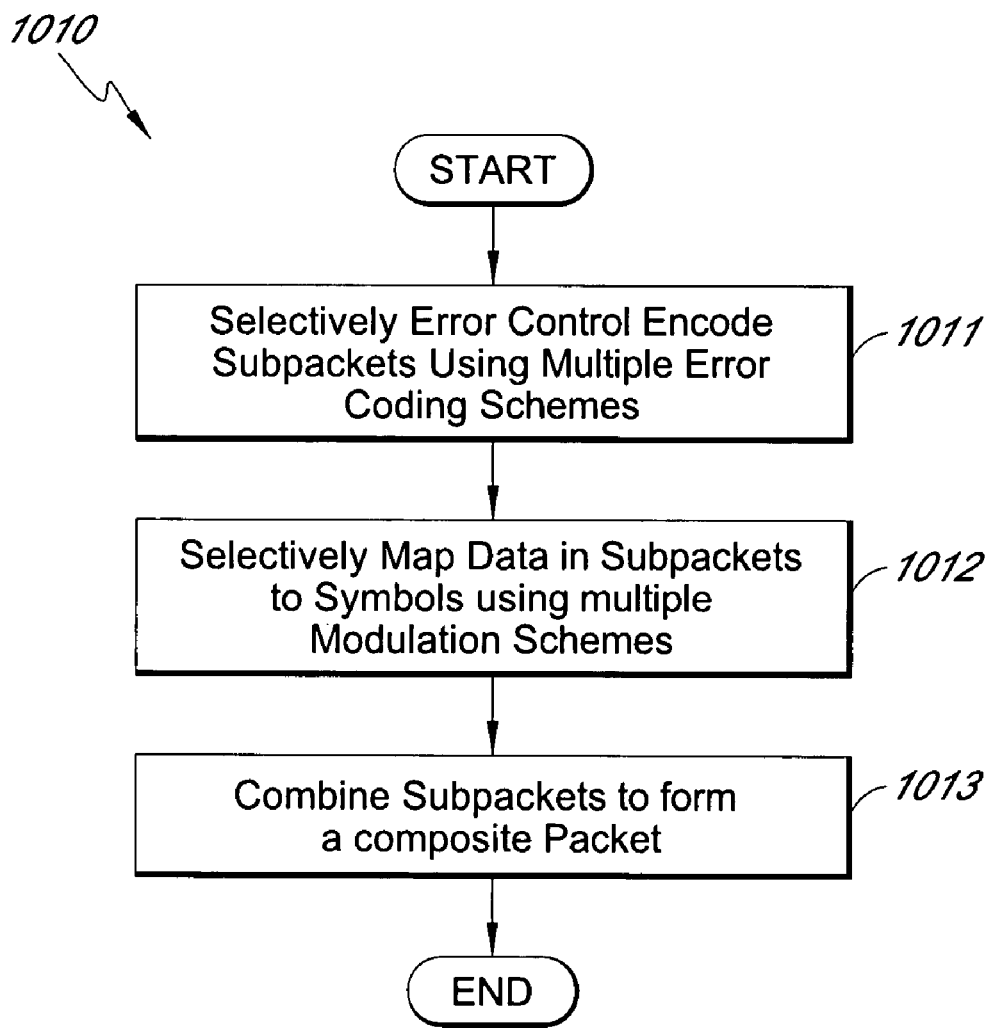

FIG. 10b is a flowchart illustrating in more detail an example of certain functions performed at block 1010 of the method illustrated in FIG. 10a. At block 1011, each of the subpackets is selectively error control encoded using multiple forward error control (FEC) coding schemes. As discussed above, the multiple FEC schemes may include Unequal Error Protection (UEP) schemes and Equal Error Protection (EEP) schemes. UEP schemes typically use different FEC schemes for different portions of data, whereas EEP schemes use the same FEC scheme for all portions of data. UEP schemes may use a first FEC scheme for the most significant bits and may use a second FEC scheme for the least significant bits. Other forms of UEP known to skilled technologists may also be used. As discussed above, the various FEC schemes append CRCs to the subpackets for use by the receiving device in confirming that the correct bits are received. The CRCs may comprise two parts, one for the MSB's and one for the LSB's. Also, a single CRC or pair of CRC's (an MSB and LSB pair) may be computed for two or more packets within an ACK group, as discussed above. The FEC subsystem 720 of the wireless transmitter 700 shown in FIG. 7 may perform the functions at the block 1011.

At block 1012, the bits of the subpackets are selectively mapped to symbols using multiple modulation schemes. The symbols are typically complex (IQ) symbols (frequency domain data). The complex symbols are used to modulate a carrier for the wireless transmission described above. The multiple modulation schemes may include Binary Phase-Shift Keying (BPSK), Quadrature Phase-Shift Keying (QPSK), and Quadrature Amplitude Modulation (QAM). By using different modulation schemes for the different subpackets, more critical data may be protected with more robust modulation schemes and less critical data may be protected with less robust schemes. In some embodiments, the multiple FEC schemes used at the block 1011 and the multiple modulation schemes used at block 1012 may be combined into a plurality of MCS (modulation/coding scheme) pairs. Information identifying which MCS pairs are used for each subpacket are encoded into the HRP MCS mode field 950 of the PHY header 904 as shown in FIG. 9c. The symbol mapper subsystem 725 of the wireless transmitter 700 shown in FIG. 7 may perform the functions at the block 1012.

After the selective error control coding of the block 1011 and the selective symbol mapping of the block 1012 are performed, the subpackets are combined at block 1013 to form the composite packet. In addition to combining the subpackets, the header information, CRC information and any other trailer or header fields may also be combined at the block 1013. The header information comprises a plurality of information fields related to identifying the error control coding and the mapping modes used on each subpacket, as well as subpacket lengths and other information that is used by the receiving device for decoding the composite packet. The header information may also include the various fields in the PHY header 904, the MAC header 906, the MAC header extension 908, the video header 910 and the header CRC field 914 as shown in FIGS. 9a to 9f. The packet coding subsystem 730 of the wireless transmitter 700 may perform the encoding of the header information. The composite packet may be configured as is the composite packet 900 shown in the FIGS. 9a to 9f. However, the fields of the composite packet may be rearranged, combined or omitted from those shown in FIGS. 9a to 9f. The packetization subsystem 735 of the wireless transmitter 700 shown in FIG. 7 may perform the functions at the block 1013.

Returning to FIG. 10a, after forming the composite packet at the block 1010, the method 1000 continues at block 1015, where the composite packet is transmitted over the high rate channel to one or more receiver devices. Various methods of transmitting the composite packet over wired and/or wireless communication links may be used, but these methods are not discussed herein. The transmitter portion of the transceiver subsystem 715 of the wireless transmitter 700 of FIG. 7 may perform the functions at the block 1015.

After the composite packet is transmitted at the block 1015, the transmitter device waits to receive one or more ACK messages from the device receiving the composite packet. As discussed above, an ACK message may be mapped to one or more of the subpackets within the composite packet. The ACK messages are typically transmitted over the low rate channel. A block of time in the CTB frame 515 of a superframe 500, as shown in FIG. 5a, may be reserved for the receiving device to transmit the ACK messages over the low rate channel. In one example, if an ACK message is not received after a certain time limit, the method 1000 continues to block 1025, where the transmitter determines that the ACK was not received and the method returns to block 1010. At block 1010, a new composite packet is formed including the unacknowledged subpacket or subpackets that were included in the unacknowledged ACK group. If there were no unacknowledged subpackets identified at block 1025, the method 1000 may still return to the block 1010 if more information that was obtained at block 1005 still remains to be packetized and transmitted. If no subpackets need to be retransmitted and there is no more information to packetize and transmit, the method 900 ends. The receiver portion of the transceiver subsystem 715 of the wireless transmitter 700 of FIG. 7 may perform the functions at the block 720. The packetization subsystem 735 of the wireless transmitter 700 shown in FIG. 7 may perform the functions at decision block 1025.

Figure 11:
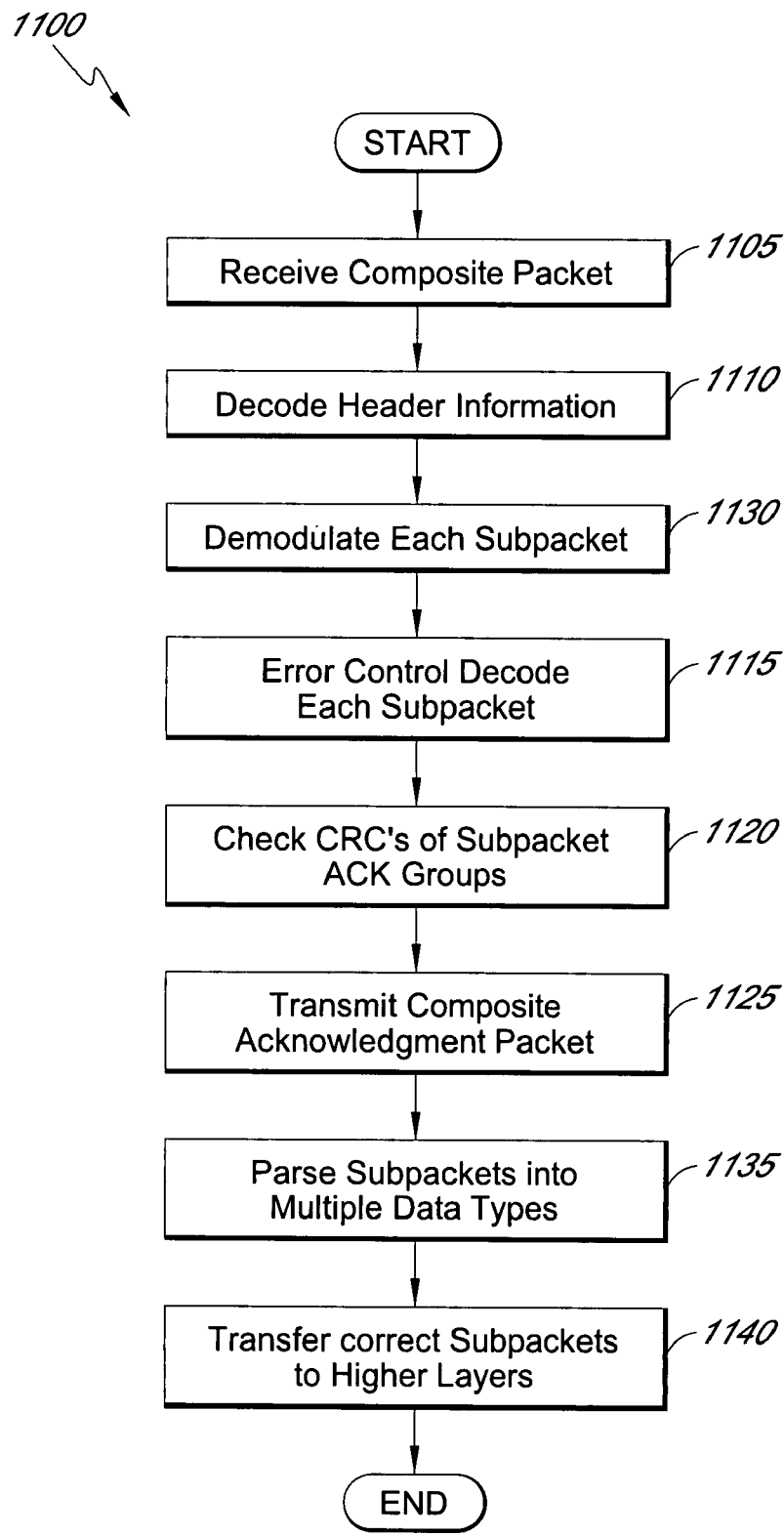
FIG. 11 is a flowchart illustrating an example of a method of receiving composite packets of multimedia data in a system such as illustrated in FIG. 2.

FIG. 11 is a flowchart illustrating an example of a method 1100 of receiving composite packets of multimedia data in a system such as illustrated in FIG. 2. The method 1100 can be used to decode composite packets such as the composite packet 900 shown in FIGS. 9a to 9f. However, other composite packet configurations may also be decoded. The method 1100 receives the composite packets from a transmitting device and may transmit acknowledgement messages back to the transmitting device. The method 1100 can be performed in a wireless network by a receiver device such as the wireless receiver device 800 shown in FIG. 8. The method may also be performed over wireline networks or combination wireline and wireless networks.

The method 1100 starts at block 1105, where the composite packet is received over a communication link. The communication link may be wired or wireless. The signal may be transmitted using one or more PHY layer transmission techniques such as OFDM, CDMA, etc. In one embodiment, the composite packet is received over a high rate channel that at least partially overlaps a low rate channel where the high rate and low rate channels are time division duplexed as discussed above. The receiver portion of the transceiver subsystem 815 of the wireless receiver 800 may perform the functions at the block 1105.

After receiving the composite packet at block 1105, the method 1100 continues at block 1110 where the header information is decoded. Decoding the header information can include demodulating (e.g., demapping) the symbols of the header depending on the modulation scheme. A CRC is then calculated for the header portion which is compared with the received CRC (e.g., the header CRC field 914 shown in FIG. 9a). If the received header CRC agrees with the calculated CRC, then the header information can be trusted and used to decode the payload of the composite packet which includes the multiple subpackets. The FEC subsystem 820 and the demapper subsystem 825 can perform the functions at the block 1110.

By using the received header information identifying the modulation schemes for each subpacket, the method 1100 continues at block 1130 where the receiver demodulates each subpacket depending on the modulation scheme that was used in encoding the subpacket. The receiver device converts or demaps the complex frequency domain data back into the datastream bits that the symbol were encoded by the transmitter device. The receiver device demaps the subpackets in different ways corresponding to the modulation schemes used to modulate the different subpackets. Demapping techniques known to skilled technologists can be used to demap any of the modulation schemes discussed above in relation to the symbol mapper 725 of FIG. 7. The demapper subsystem 825 of the receiver device 800 of FIG. 8 can perform the functions at the block 1130.

Using the header information identifying the FEC schemes used for each subpacket, the receiver device error control decodes each of the subpackets contained in the composite packet at the block 1115. The receiver device detects and corrects errors in the various subpackets of the composite packet depending on the FEC scheme used to encode the various portions. At block 1120, the receiver calculates CRC value(s) based on the decoded portion(s) (e.g., the portion on which error detection and correction was performed) of the packet that the transmitter-appended CRC(s) corresponded to. If the receiver-calculated CRC agrees with the transmitter-appended CRC, then a positive acknowledgement may be transmitted at block 1125 to the transmitter device over the low rate channel. If the CRC's do not agree, then no acknowledgement is sent, or a negative acknowledgement may be sent at the block 1125, depending on the embodiment. The ACK messages to be sent may be mapped to the multiple subpackets of the composite packet using any of the methods discussed above in relation to FIGS. 9a to 9f. A single ACK message may be mapped to one subpacket or a plurality of subpackets. A plurality of ACK messages may be combined into a composite ACK packet as discussed above in reference to FIG. 6b. The composite ACK message can then be transmitted over the low rate channel. The FEC subsystem 820 of the receiver device 800 of FIG. 8 can perform the functions at the blocks 1115 and 1120. The transmitter portion of the transceiver subsystem 815 of the receiver device 800 can perform the functions at the block 1125.

After the subpackets are acknowledged at the block 1125, the receiver device parses the subpackets into the corresponding data types at block 1135. The parsed data types are then transferred to higher layer applications at block 1140. The subpacket parser subsystem 830 can perform the functions at the blocks 1135 and 1140.

The system of a transmitter embodiment includes means for selectively error control encoding data in two or more subpackets using one or more error coding schemes selected from a plurality of error coding schemes, means for selectively mapping the data in each of the subpackets to symbols using one or more modulation schemes selected from a plurality of modulation schemes, and means for combining the subpackets to form a composite packet. With reference to FIG. 7, aspects of this embodiment include where the error control coding means is the FEC subsystem 720, where the mapping means is the symbol mapper 725 and where the combining means is the packetization subsystem 735.

Another embodiment is a system for receiving uncompressed video data. The system of this embodiment includes means for receiving a composite packet comprising two or more subpackets, wherein two or more error control encoding schemes and/or two or more modulation schemes were used to selectively encode and modulate the two or more subpackets. The system further includes means for processing the subpackets to perform forward error control decoding and to demodulate each of the subpackets, wherein the forward error control decoding is related to the error control encoding scheme and the demodulating is related to the modulation scheme that were used to encode each subpacket. With reference to FIG. 8, aspects of this embodiment include where the receiving means is the transceiver 815 and where the processing means includes the FEC subsystem 820 and the demapper subsystem 825.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of transmitting uncompressed video data, the method comprising:
   selectively error control encoding data in two or more subpackets using two or more error coding schemes selected from a plurality of error coding schemes;
   selectively mapping the data in each of the subpackets to symbols using one or more modulation schemes;
   combining the subpackets to form a composite packet comprising a first cyclic redundancy check based on first significant bits and a second cyclic redundancy check based on second significant bits, wherein the first significant bits and the second significant bits combine to form the mapped data symbols; and
   transmitting the composite packet over a wireless communication link, wherein subpackets that are selectively encoded and selectively mapped using the same error coding scheme and the same modulation scheme are combined to be adjacent in the composite packet.

2. The method of claim 1, wherein the subpackets comprise data related to two or more types of multimedia data.

3. The method of claim 2, wherein the types of multimedia data comprise at least two of video data, audio data, control data and text.

4. The method of claim 1, further comprising:
encoding a packet header comprising a plurality of information fields, the information fields related at least in part to identifying the error control coding or the mapping of the subpackets; and
combining the packet header and the subpackets to form the composite packet.

5. The method of claim 4, further comprising error control encoding the packet header using the most reliable error coding and mapping the packet header using the most reliable modulation scheme, wherein the most reliable error coding scheme and the most reliable modulation scheme provide equal error protection.

6. The method of claim 4, wherein the packet header further comprises at least one length field related to a length of one or more of the subpackets.

7. The method of claim 4, wherein the packet header further comprises at least one acknowledgement field used to map a fixed number of acknowledgement messages to one or more of the subpackets, the acknowledgement messages to be transmitted by a receiving device.

8. The method of claim 7, wherein one of the fixed number of acknowledgement messages is mapped to at least two subpackets, the composite packet further comprising a cyclic redundancy check related to the content of the at least two subpackets mapped to the one acknowledgement message.

9. The method of claim 7, wherein the acknowledgement field used to map the fixed number of acknowledgement messages to one or more of the subpackets uses a string of continuous "1"s or "0"s to indicate subpackets to be acknowledged with the same acknowledgement message.

10. The method of claim 7, wherein the acknowledgement field used to map the fixed number of acknowledgement messages to one or more of the sub packets uses a "1" to indicate the last subpacket in an ACK group to be acknowledged by one of the acknowledgement messages and uses a "0" to indicate that a sub-packet is to be included in the same ACK group to be acknowledged by one of the acknowledgement messages.

11. A method of receiving uncompressed video data, the method comprising:
receiving a composite packet comprising two or more subpackets, wherein two or more error control encoding schemes were used to selectively encode the two or more subpackets, the composite packet further comprising a first cyclic redundancy check based on most significant bits and a second cyclic redundancy check based on least significant bits, wherein the most significant bits and the least significant bits combine to form the mapped data symbols; and
processing the subpackets to perform forward error control decoding of each of the subpackets, wherein the forward error control decoding is related to the error control encoding scheme used to encode each subpacket.

12. The method of claim 11, wherein the subpackets comprise data related to two or more types of multimedia data.

13. The method of claim 12, wherein the types of multimedia data comprise at least two of video data, audio data, control data and text.

14. The method of claim 11, further comprising receiving the composite packet over a wireless communication link.

15. The method of claim 11, wherein the composite packet further comprises a packet header comprising a plurality of information fields, the information fields related at least in part to identifying the error control coding or the mapping used for processing the subpackets.

16. The method of claim 15, wherein the packet header further comprises at least one length field related to a length of one or more of the subpackets.

17. The method of claim 15, wherein the packet header further comprises at least one acknowledgement field used to map a fixed number of acknowledgement messages to one or more of the subpackets, the acknowledgement messages to be transmitted by a receiving device.

18. The method of claim 17, wherein one of the fixed number of acknowledgement messages is mapped to at least two subpackets, the composite packet further comprising a cyclic redundancy check related to the content of the at least two subpackets mapped to the one acknowledgement message.

19. A system for transmitting uncompressed video data, the system comprising:
a forward error control subsystem configured to selectively error control encode data in each of a plurality of subpackets using two or more error coding schemes selected from a plurality of error coding schemes;
a mapper subsystem configured to selectively map the data in each of the subpackets to symbols using one or more modulation schemes;
a packetization subsystem configured to combine the subpackets to form a composite packet comprising a first cyclic redundancy check based on most significant bits and a second cyclic redundancy check based on least significant bits, wherein the most significant bits and the least significant bits combine to form the mapped data symbols; and
a transmitter configured to transmit the composite packet over a wireless communication link,
wherein subpackets that are selectively encoded and selectively mapped using the same error coding scheme and the same modulation scheme are combined to be adjacent in the composite packet.

20. The system of claim 19, wherein the subpackets comprise data related to two or more types of multimedia data.

21. The system of claim 20, wherein the types of multimedia data comprise at least two of video data, audio data, control data and text.

22. The system of claim 19, further comprising:
a packet coding subsystem configured to encode a packet header comprising a plurality of information fields, the information fields related at least in part to identifying the error control coding or the mapping of the subpackets; and
the packetization subsystem further configured to combine the packet header and the subpackets to form the composite packet.

23. The system of claim 22, wherein the forward error control subsystem is further configured to error control encode the packet header using the most reliable equal error protection error coding scheme and the mapper subsystem is further configured to map the packet header using the most reliable equal error protection modulation scheme.

24. The system of claim 22, wherein the packet header further comprises at least one length field related to a length of one or more of the subpackets.

25. The system of claim 22, wherein the packet header further comprises at least one acknowledgement field used to map a fixed number of acknowledgement messages to one or more of the subpackets, the acknowledgement messages to be transmitted by a receiving device.

26. The system of claim 25, wherein one of the fixed number of acknowledgement messages is mapped to at least two subpackets, the composite packet further comprising a cyclic redundancy check related to the content of the at least two subpackets mapped to the one acknowledgement message.

27. The system of claim 25, wherein the acknowledgement field used to map the fixed number of acknowledgement messages to one or more of the subpackets uses a string of continuous "1"s or "0"s to indicate subpackets to be acknowledged with the same acknowledgement message.

28. The system of claim 25, wherein the acknowledgement field used to map the fixed number of acknowledgement messages to one or more of the subpackets uses a "1" to indicate the last subpacket in an ACK group to be acknowledged by one of the acknowledgement messages and uses a "0" to indicate that a sub-packet is to be included in the same ACK group to be acknowledged by one of the acknowledgement messages.

29. A system for receiving uncompressed video data, the system comprising:
a receiver configured to receive a composite packet comprising two or more subpackets, wherein two or more error control encoding schemes were used to selectively encode the two or more subpackets, the composite packet further comprising a first cyclic redundancy check based on most significant bits and a second cyclic redundancy check based on least significant bits, wherein the most significant bits and the least significant bits combine to form the mapped data symbols;
a forward error control subsystem configured to perform forward error control decoding of the subpackets based on which error control encoding scheme was used to encode each subpacket; and
a receiver configured to receive the composite packet over a wireless communication link.

30. The system of claim 29, wherein the subpackets comprise data related to two or more types of multimedia data.

31. The system of claim 30, wherein the types of multimedia data comprise at least two of video data, audio data, control data and text.

32. The system of claim 29, wherein the composite packet further comprises a packet header comprising a plurality of information fields, the information fields related at least in part to identifying the error control coding or the mapping used for processing the subpackets.

33. The system of claim 32, wherein the packet header further comprises at least one length field related to a length of one or more of the subpackets.

34. The system of claim 32, wherein the packet header further comprises at least one acknowledgement field used to map a fixed number of acknowledgement messages to one or more of the subpackets, the acknowledgement messages to be transmitted by a receiving device.

35. The system of claim 34, wherein one of the fixed number of acknowledgement messages is mapped to at least two subpackets, the composite packet further comprising a cyclic redundancy check related to the content of the at least two subpackets mapped to the one acknowledgement message.

36. A system for transmitting uncompressed video data, the system comprising:
means for selectively error control encoding data in two or more subpackets using two or more error coding schemes selected from a plurality of error coding schemes;
means for selectively mapping the data in each of the subpackets to symbols using one or more modulation schemes, wherein the means for selectively mapping the data selects the one or more modulation schemes from a plurality of modulation schemes;
means for combining the subpackets to form a composite packet; and
means for transmitting the composite packet over a wireless communication link.

37. A system for receiving uncompressed video data, the system comprising:
means for receiving a composite packet comprising two or more subpackets, wherein two or more error control encoding schemes were used to selectively encode the two or more subpackets, the composite packet further comprising a first cyclic redundancy check based on most significant bits and a second cyclic redundancy check based on least significant bits, wherein the most significant bits and the least significant bits combine to form mapped data symbols; and
means for processing the subpackets to perform forward error control decoding of each of the subpackets, wherein the forward error control decoding is related to the error control encoding scheme used to encode each subpacket.

38. The method of claim 1, wherein selectively mapping the data comprises selecting the one or more modulation schemes from a plurality of modulation schemes.

39. The system of claim 19, wherein the mapper subsystem is further configured to select the one or more modulation schemes from a plurality of modulation schemes.

40. The method of claim 11, wherein two or more modulation schemes were used to selectively modulate the two or more subpackets and wherein processing the subpackets further comprises demodulating each of the subpackets, wherein the demodulation is related to the modulation scheme used to modulate each subpacket.

41. The system of claim 29, wherein two or more modulation schemes were used to selectively modulate the two or more subpackets, further comprising a demapper subsystem configured to demodulate the subpackets based on the modulation scheme that was used to modulate each subpacket.

42. The system of claim 37, wherein two or more modulation schemes were used to selectively modulate the two or more subpackets, wherein the means for processing the subpackets demodulates each of the subpackets, and wherein the demodulation is related to the modulation scheme used to modulate each subpacket.

43. A method of transmitting uncompressed video data, the method comprising:
selectively error control encoding data in two or more subpackets using two or more error coding schemes selected from a plurality of error coding schemes;
selectively mapping the data in each of the subpackets to symbols using one or more modulation schemes;
combining the subpackets to form a composite packet comprising a first cyclic redundancy check based on most significant bits and a second cyclic redundancy check based on least significant bits, wherein the most significant bits and the least significant bits combine to form mapped data symbols;
transmitting the composite packet over a wireless communication link;

encoding a packet header comprising a plurality of information fields, the information fields related at least in part to identifying the error control coding or the mapping of the subpackets; and combining the packet header and the subpackets to form the composite packet, wherein subpackets that are selectively encoded and selectively mapped using the same modulation scheme are combined to be adjacent in the composite packet.

44. A method of transmitting uncompressed video data, the method comprising:

selectively error control encoding data in two or more subpackets using two or more error coding schemes selected from a plurality of error coding schemes;

selectively mapping the data in each of the subpackets to symbols using one or more modulation schemes;

combining the subpackets to form a composite packet; and transmitting the composite packet over a wireless communication link, the composite packet further comprising a first cyclic redundancy check based on most significant bits and a second cyclic redundancy check based on least significant bits, wherein the most significant bits and the least significant bits combine to form the mapped data symbols.

45. A system for transmitting uncompressed video data, the system comprising:

a forward error control subsystem configured to selectively error control encode data in each of a plurality of subpackets using two or more error coding schemes selected from a plurality of error coding schemes;

a mapper subsystem configured to selectively map the data in each of the subpackets to symbols using one or more modulation schemes;

a packetization subsystem configured to combine the subpackets to form a composite packet, the composite packet further comprising a first cyclic redundancy check based on most significant bits and a second cyclic redundancy check based on least significant bits, wherein the most significant bits and the least significant bits combine to form the mapped data symbols; and a transmitter configured to transmit the composite packet over a wireless communication link.

46. The method of claim 1, wherein the first significant bits are most significant bits and the second significant bits are least significant bits.

* * * * *